US007088427B2

(12) United States Patent
Smith et al.

(10) Patent No.: US 7,088,427 B2
(45) Date of Patent: Aug. 8, 2006

(54) APPARATUS AND METHOD FOR HIGH RESOLUTION IN-SITU ILLUMINATION SOURCE MEASUREMENT IN PROJECTION IMAGING SYSTEMS

(75) Inventors: Adlai H. Smith, Escondido, CA (US); Robert O. Hunter, Jr., San Diego, CA (US); Bruce McArthur, San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 10/828,579

(22) Filed: Apr. 20, 2004

(65) Prior Publication Data

US 2005/0231705 A1 Oct. 20, 2005

(51) Int. Cl.
*G03B 27/72* (2006.01)

(52) U.S. Cl. .......................................... 355/69; 355/71

(58) Field of Classification Search .................. 355/69, 355/71

See application file for complete search history.

(56) References Cited

U.S. PATENT DOCUMENTS 4,861,148 A 8/1989 Sato et al.
5,285,236 A 2/1994 Jain
5,581,075 A 12/1996 Naraki et al.
5,808,814 A 9/1998 Kudo
6,096,461 A 8/2000 Gelbart
6,133,986 A 10/2000 Johnson
6,142,641 A 11/2000 Cohen et al.
6,356,345 B1 3/2002 McArthur et al.
6,741,338 B1 * 5/2004 McArthur et al. .......... 356/121
2002/0071472 A1 * 6/2002 Dickson et al. ............. 372/102

FOREIGN PATENT DOCUMENTS

JP 61-210627 9/1986

OTHER PUBLICATIONS

R. DeJule, “Mix-and-Match: A Necessary Choice”, Semiconductor International, Feb. 2000, pp. 66-76.

D G. Flagello et al., “Understanding Systematic and Random CD Variation Using Predictive Modelling Techniques”, Proc. SPIE vol. 3679, Mar. 1999, pp. 162-175.

D. Cote et al., “Micrascan™ III Performance of a Third Generation, Catadioptric Step and Scan Lithographic Tool”, Proc. SPIE vol. 3051, pp. 806-816.

J. Mulkens et al., “ArF Step and Scan Exposure System for 0.15 μm and 0.13 μm Technology Node?”, Proc. SPIE vol. 3679, Mar. 1999, pp. 506-521.

(Continued)

*Primary Examiner*—W. B. Perkey
*Assistant Examiner*—Vivian Nelson

(57) ABSTRACT

An in-situ apparatus for high resolution imaging in lithographic steppers and scanners (machines) is described. It comprises a multiple field in-situ imaging objective that images the source directly onto the machine reticle or objective plane. The image on the wafer side of the machine is then recorded electronically or in photo resist. Alternative embodiments create source images at locations before or beyond the wafer plane that can be more conveniently recorded with sensors embedded in the wafer stage chuck.

18 Claims, 22 Drawing Sheets

OTHER PUBLICATIONS

M. A. van den Brink et al., "New 0.54 Aperture i-Line Wafer Stepper with Field by Field Leveling Combined with Global Alignment", Proc. SPIE vol. 1463, 1991, pp. 709-724.
R. Rogoff et al., "Photolithography Using the Aerial™ Illuminator in a Variable NA Wafer Stepper", 1996, pp. 1-17.
J. Mulkens et al., "High Throughput Wafer Steppers with Automatically Adjustable Conventional and Annular Illumination Modes", pp. 1-14.
L. Liebmann et al., "Understanding Across Chip Line Width Variation: The First Step Toward Optical Proximity Correction", Proc. SPIE vol. 3051, 1997, pp. 124-136.
J. van Schoot et al., "0.7 NA DUV Step & Scan System for 150nm Imaging with Improved Overlay", Proc. SPIE vol. 3679, 1999, pp. 448-456.
H.G. Müller et al., "Large Area Fine Line Patterning by Scanning Projection Lithography", MCM Proceedings, 1994, pp. 100-104.
J.E. Bjorkholm et al., "Reduction Imaging at 14 nm Using Multilayer-coated Optics: Printing of Features Smaller than 0.1 •m", J. Vac. Sci. Technol. B8(6), pp. 1509-1513, 1990.
B.E. Newnam et al., "Development of XUV Projection Lithography at 60-80 nm", Proc. SPIE, vol. 1671, 1992, pp. 419-436.
J. Kirk et al., "Pinholes and Pupils Fills", Microlithography World , Autumn 1997, pp. 25-28.
N. Farrar et al., "Illuminator Characterization Using In-Siu Reticle Diagnostic Structures".
N. Seong et al., "Differences of Pattern displacement Error Under Different Illumination Conditions", Proc. SPIE, vol. 3334, 1998, pp. 868-872.
N. R. Farrar, "Effect of Off-Axis Illumination on Stepper Overlay", Proc. SPIE, vol. 2439, 1995, pp. 273-275.
J. H. Bruning, "Optical Lithography—thirty Years and Three Orders of Magnitude", Proc. SPIE vol. 3051, 1997, pp. 14-27.
D. G. Flagello et al., "Towards a Comprehensive Control of Full-Field Image Quality in Optical Photolithography", 1997, pp. 1-14.
J. Greeneich et al., "Advanced i-Line Illumination", Microlithography World, 1996, pp. 7-8.
D. W. Peters, "The Effects of an Incorrect Condenser Lens Setup on Reduction Lens Printing Capabilities", pp. 457-463.
N. M. Ceglio et al., "Soft X-Ray Projection Lithography", J. Vac. Sci. Technol. B 8 (6), Nov./Dec. 1990, pp. 1325-1328.
Y. Borodovsky, "Impact of Local Partial Coherence Variations on Exposure Tool Performance", Proc. SPIE, vol. 2440, pp. 750-770.
H. Nomura et al., "Overlay Error Due to Lens Coma and Asymmetric Illumination Dependence on Pattern Feature", Proc. SPIE vol. 3332, pp. 199-210.
B. Katz et al., "High Numerical Aperture I-Line Stepper".
D. S. Goodman et al., "Condenser Aberrations in Köhler Illumination", Proc. SPIE vol. 922, 1988, pp. 108-134.
C. Krautschik et al., "Mathematical Treatment of Condenser Aberrations and their Impact on Linewidth Control", Final Rev, Mar. 23, 1999, pp. 1-12.
International Technology Roadmap for Semiconductors, 2001 Edition, Front End Process, SEMATECH, pp. 1-44.
International Technology Roadmap for Semiconductors, 2001 Edition, Executive Summary , SEMATECH, pp. 1-58.
International Technology Roadmap for Semiconductors, 2001 Edition, Lithography , SEMATECH, pp. 1-17.
International Technology Roadmap for Semiconductors, 2001 Edition, Metrology, SEMATECH, pp. 1-25.
International Technology Roadmap for Semiconductors, 2001 Edition, Modeling and Simulation, SEMATECH, pp. 1-16.
International Technology Roadmap for Semiconductors, 2001 Edition, Yield Enhancement, SEMATECH, pp. 1-27.
J. E. Bjorkholm, "EUV Lithography—the Successor to Optical Lithography?", Intel Technology Journal, 1998, pp. 1-8.
M. L. Freed, "Wafer-Mounted Sensor Arrays for Plasma Etch Processes", 2001, pp. 159.
G. J. Swanson, "Binary Optics Technology: The Theory and Design of Multi-Level Diffractive Optical Elements", Aug. 1989, pp. 47.
W. Däschner et al., "General Aspheric Refractive Micro-Optics Fabricated by Optical Lithography Using a High Energy Beam Sensitive Glass Gray-Level Mask".
J. Vac. Sci. Technol., B 14(6), Nov./Dec. 1996, pp. 3730-3733.
A.J. de Ruyter et al., "Examples of Illumination Source Effects on Imaging Performance", Arch Chemicals Microlithography Symposium, Sep. 22, 2003, pp. 1-8.
Born et al., "Principles of Optics", 1959, pp. 524-526.
International Search Report and The Written Opinion of the International Searching Authority for PCT/US2005/012498 dated Apr. 12, 2006, 12 pgs.
Masakatsu, "Pinhole Plate For Measuring Effective Light Source", Japanese Publication No. 61210627, Patent Abstracts of Japan.

* cited by examiner

ARB = Axial Ray Bundle
MRB = Marginal Ray Bundle

Provide MFISIO

Load MFISIO

Expose sensor array

Read sensor output

Reconstruct radiant Intensity

Figure 20

| x | y | nx | ny | $\frac{1}{N}\frac{dE}{do}$ (nx, ny, x, y) |
|---|---|---|---|---|
| -10 | 0 | -.6 | -.6 | 0 |
| -10 | 0 | -.6 | -.5 | 0.01 |
| • | • | • | • | • |
| • | • | • | • | • |
| • | • | • | • | • |
| 10 | 0 | +.6 | +.6 | 0 |

APPARATUS AND METHOD FOR HIGH RESOLUTION IN-SITU ILLUMINATION SOURCE MEASUREMENT IN PROJECTION IMAGING SYSTEMS

BACKGROUND OF THE INVENTION

1. Field of the Invention

The present invention relates generally to processes for semiconductor manufacturing and more particularly to the area of optical lithography.

2. Description of Related Art

Reductions in the size of semiconductor chips requires a proportional tightening of lithographic projection machine (machine) performance and a corresponding improvements in variance from machine to machine and across the machine projection field. See, for example, "International Technology Roadmap for Semiconductors", 2001 Edition, Executive Summary; "International Technology Roadmap for Semiconductors", 2001 Edition, Front End Processes; "International Technology Roadmap for Semiconductors", 2001 Edition, Lithography, "International Technology Roadmap for Semiconductors", 2001 Edition, Metrology; "International Technology Roadmap for Semiconductors", 2001 Edition, Modeling and Simulation, "International Technology Roadmap for Semiconductors", 2001 Edition, Yield Enhancement.

Presently lithographers adjust the properties of the illumination source (partial coherence, annularity, etc.) to increase the useable processing window. See, for example, "High Throughput Wafer Steppers with Automatically Adjustable Conventional and Annular Illumination Modes", J. Mulkens et al. As used herein, "illumination source" means the collective effect of the pre-reticle optics (such as mirrors, homogenators, lenses, polarizers, diffusers, etc.) and the light source (mercury arc lamp, excimer laser, synchrotron radiation, etc.) on creating a radiant intensity pattern (energy per unit solid angle) at the reticle. For Kohler Illumination (see, for example, "Principles of Optics", M. Born et al., *Pergamon Press*, 524:526), the source on a particular machine, and for a particular machine setting, is completely characterized by the radiant intensity given by:

$$\frac{dE}{do}(nx, ny; x, y) = \text{energy per unit solid angle coming from direction } (nx,ny) \text{ and at transverse spatial position } (x,y) \text{ on the reticle.} \quad \text{(Equation 1)}$$

The ability to predict lithographic performance, especially cross-field or machine to machine variation, is contingent on quantitatively knowing the factors causing variation and this includes the illumination source $$\left(\frac{dE}{do} \text{ of Equation 1}\right).$$

The effect of the illumination source (source) when coupled to projection imaging objective (PIO, or lens that relay the reticle object plane to the wafer plane) aberrations has been documented, as has the deleterious effects of improperly or non-optimally configured sources themselves on lithographic printing. See, for example, "Differences of Pattern Displacement Error Under Different Illumination Conditions", N. Seong et al., *SPIE*, Vol. 3334, 868:872, 1998; "Effect of Off-Axis Illumination on Stepper Overlay", N. Farrar, *SPIE*, Vol. 2439, 273:275, 1995; "Overlay Error Due to Lens Coma and Asymmetric Illumination Dependence", H. Nomura et al., *SPIE*, Vol. 3332, 199:210, 1998; and see "The Effects of an Incorrect Condenser Lens Setup on Reduction Lens Printing Capabilities", D. Peters, *Interface* 85, Kodak Publ. No. G-154, 66:72, 1985; "Impact of Local Partial Coherence Variations on Exposure Tool Performance", Y. Borodovsky, *SPIE*, Vol. 2440, 750:770, 1995; "Condenser Aberrations in Kohler Illumination", D. Goodman et al., *SPIE*, Vol. 922, 108:134, 1988; "Mathematical Treatment of Condenser Aberrations and their Impact on Linewidth Control", C. Krautschik et al., *Intel*, 1:12, 1998; "Examples of Illumination Source Effects on Imaging Performance", A. J. deRuyter et al., *ARCH Chemicals Microlithography Symposium*, 2003. Comprehensive modeling will generally require knowing the radiant intensity across the projection field, machine settings, and machines. See, for example, "Understanding Systematic and Random CD Variations using Predictive Modeling Techniques", D. Flagello et al., *SPIE*, Vol. 3679, 162:175, March 1999; "Understanding Across Chip Line Width Variation: The First Step Toward Optical Proximity Correction", L. Liebmann et al., *SPIE*, Vol. 3051, 124:136, 1997.

Typically, a lithographer will have been provided the nominal value or interpretation of each illumination setting by the machine manufacturer, and this is useful for lowest order process window determination. This is insufficient for dealing with and characterizing observed variations, for this field point and machine dependent radiant intensity is usually required. See, for example, "Examples of Illumination Source Effects on Imaging Performance", supra.

In-situ source measurement techniques have been previously described. See, for example, "Pinholes and Pupil Fills", J. Kirk et al., *Microlithography World Autumn* 1997, 25:28, 1997; "Impact of Local Partial Coherence Variations on Exposure Tool Performance", supra; "In-Situ Source Metrology Instrument and Method of Use", A. Smith et al., U.S. Pat. No. 6,356,345 issued Mar. 12, 2002. The continued drive to reduce semiconductor size has made it increasingly difficult to observe and characterize the properties of the illumination source in-situ. Therefore, the need to accurately measure high resolution illumination sources in-situ in projection imaging systems remains. It is thus advantageous to have an apparatus and method for rapid and accurate high resolution characterization of sources.

SUMMARY

A multiple field in-situ imaging objective (MFISIO) includes a multiplicity of individual imaging objectives. Each imaging objective images the source onto the reticle plane, or perhaps some other plane. The machine projection imaging objective (PIO) then relays this image to the wafer or sensor plane with sufficient resolution to permit reconstruction of a radiant intensity profile of the illumination source. The intensity profile can be processed to obtain the normalized radiant intensity $$\left(\frac{dE}{do}(nx, ny)/E_{tot}\right)$$

at a multiplicity of field points for determining the illumination source profile.

Other features and advantages of the present invention should be apparent from the following description of the preferred embodiments, which illustrate, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings, in which:

FIG. 20 shows process for measuring radiant intensity with electronic substrates or sensors.

DETAILED DESCRIPTION

Several different embodiments of systems constructed in accordance with the invention will be described. For purposes of discussion, each of these will be referred to as "main embodiments", although it should be noted that the embodiments comprise alternative constructions of systems that implement the teachings described herein.

First Main Embodiment

Figure 1:
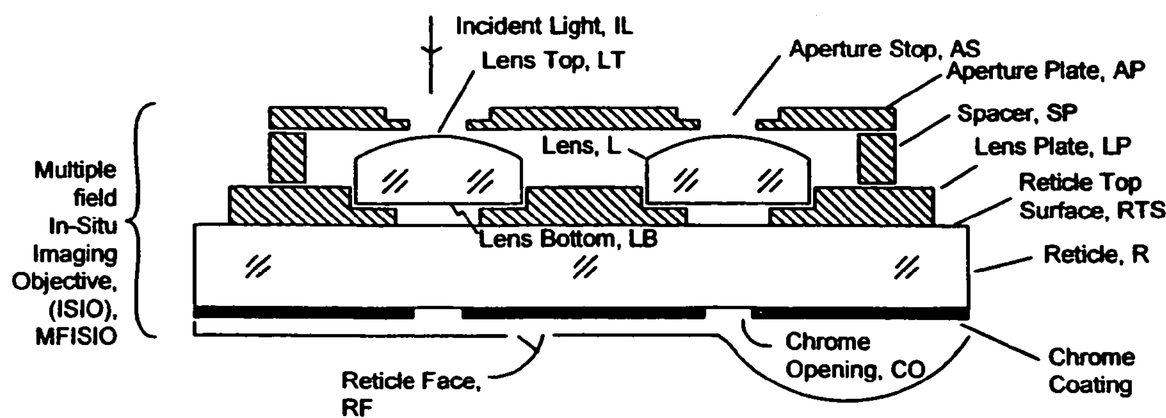
FIG. 1 shows exemplary hardware for the first and second embodiments.

FIG. 1 shows exemplary hardware for the first main embodiment. A multiple field in-situ imaging objective (MFISIO) includes a reticle R, with a lens plate LP that has attached to it multiple lenses L, and a spacer SP, which serves as a standoff and edge support for an aperture plate AP. In FIG. 1 there is one lens L and one aperture stop AS, a hole, for each in-situ imaging objective (ISIO) making up the MFISIO. Incident light IL from the source (optically located at infinity) is imaged onto chrome openings CO on the reticle face RF.

Figure 2:
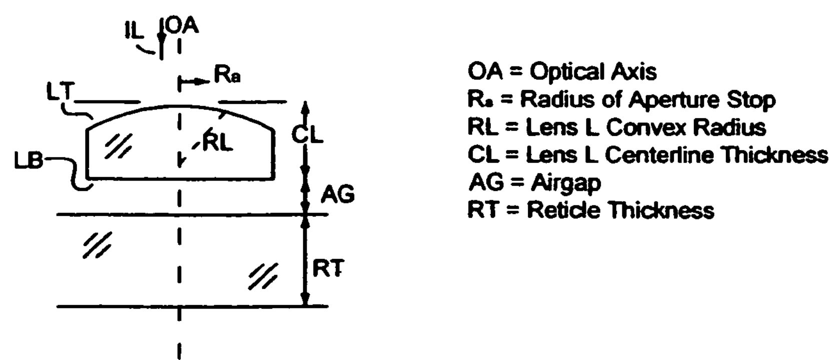
FIG. 2 shows optical design parameters and designation of same for the first and second embodiments.
Figure 3:
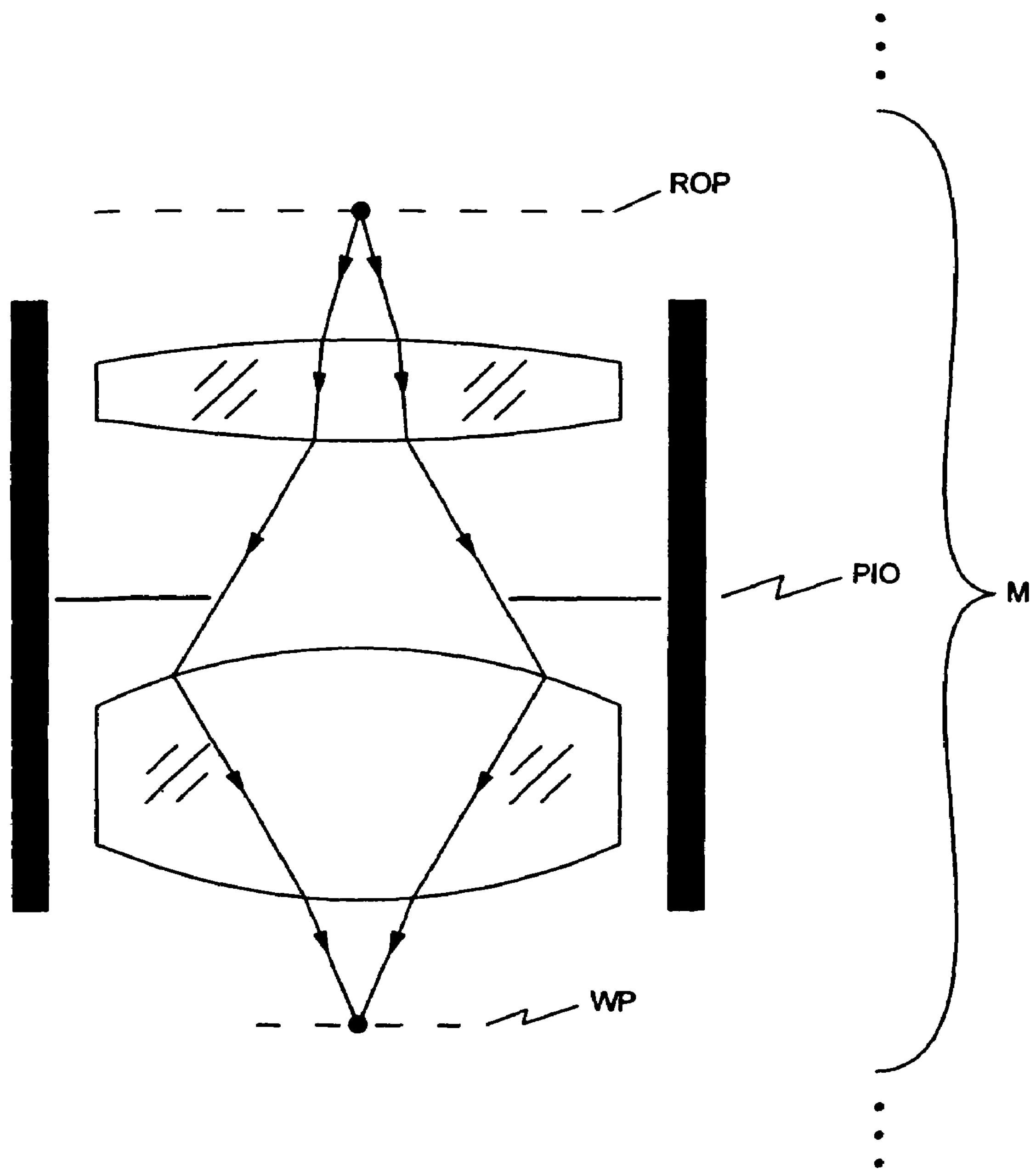
FIG. 3 shows portion of machine M showing imaging of reticle object plane to wafer plane.

FIG. 3 is a system representation that shows a machine M including a projection imaging optic PIO, which images a reticle object plane (ROP) from where a reticle face RF (not shown in FIG. 3) is located to a wafer imaging plane WP, where a top surface of a wafer W (not shown) is located. A lens L (see FIG. 1) is plano-convex and the detailed optical design parameters are shown is FIG. 2. Values for those parameters for three different designs and imaging performance characteristics are shown in Table 1 for a KrF excimer source ($\lambda$=248.5 nm) with lens/reticle material being fused silica ($SiO_2$). The design can be optimized to perform well with an object (the source) being at infinity (as it is practically in reticle side telecentric machines), of half-angle 13.9° (equivalent to $NA_S$=0.24 reticle side source numerical aperture), and including reasonable fabrication errors both for the lens L and reticle R.

TABLE 1

Exemplary Designs for Single Field ISIO of first Embodiment. $\lambda$ = 248.5 nm

| Design | $R_a$ [mm] | RL [mm] | CL [mm] | AG [mm] | RT [mm] | $f_{50\%}$ [cyc/mm] | Δn resel Mag = 4 | Δn resel Mag = 5 | $G_{min}$ | $G_{max}$ |
|---|---|---|---|---|---|---|---|---|---|---|
| 1 | 0.1 | 2.0635 | 2.1 | 0.17 | 3.81 | 62 | 0.008 | 0.010 | 0.011 | 2.202 |
| 2 | 0.2 | 2.0628 | 2.1 | 0.17 | 3.81 | 38 | 0.013 | 0.017 | 0.045 | 8.808 |
| 3 | 0.3 | 2.066 | 2.1 | 0.17 | 3.81 | 25 | 0.020 | 0.026 | 0.101 | 19.817 |

Figure 5:
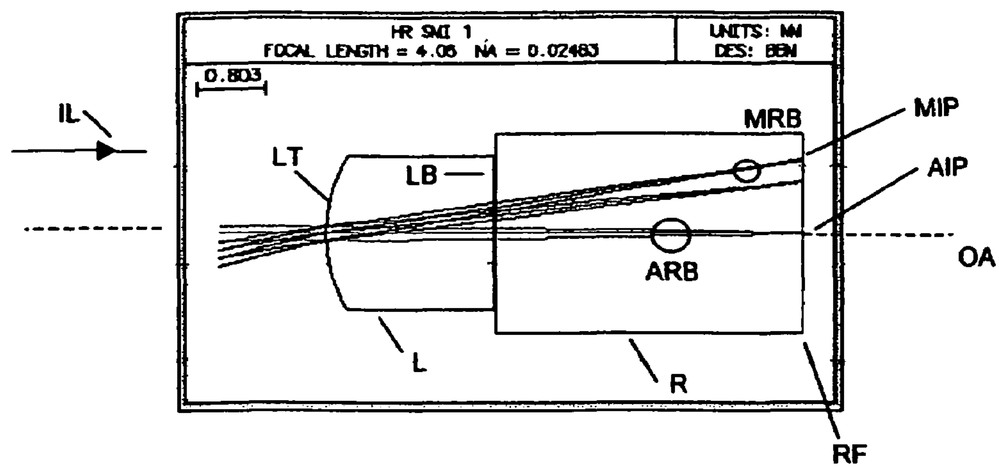
FIG. 5 shows a ray trace diagram for ISIO of the first main embodiment.
Figure 6:
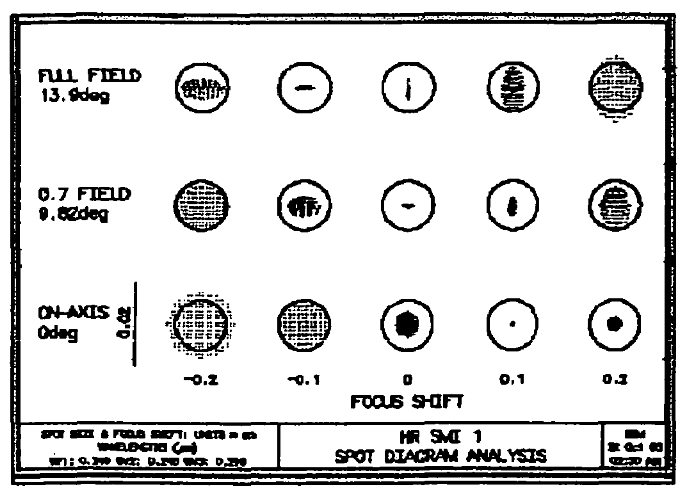
FIG. 6 shows spot diagrams at reticle face for ISIO of the first main embodiment.
Figure 7:
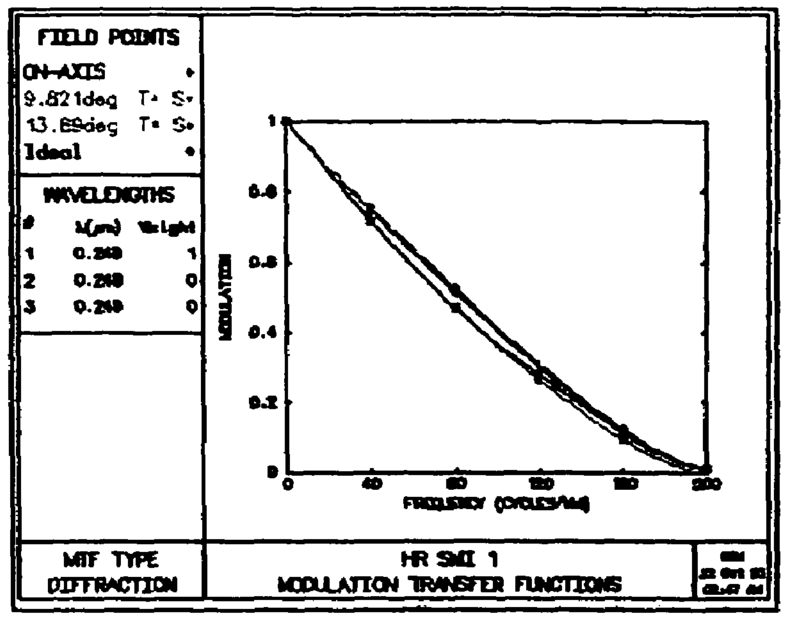
FIG. 7 shows modulation transfer function for ISIO of the first main embodiment.

FIG. 5 is a ray trace diagram for a single ISIO of Design 1 listed in Table 1. The axial ray bundle ARB represents light coming in at a transverse direction cosine $\bar{n}=0$ or perpendicular to the reticle R. The ARB is imaged to an axial image point AIP at the intersection of the ISIO optical axis OA and the reticle face RF. The marginal ray bundle MRB comprises light from the source coming in at angles of approximately 13.9° that is imaged onto the reticle face RF at a point MIP. Ray trace spot diagrams for Design 1 indicate a blur due to aberrations of lens L of size <15 μm. A useful design metric is the modulation transfer function (MTF), shown in FIG. 7. From the MTF curves, which encompass field size and fabrication errors, the lowest frequency occurs where the MTF drops to 50% (it is equal to 100% at f=0), which shall be referred to as $f_{50}$% and reported in Table 1. From $f_{50\%}$, the lens L focal length and the machine reduction magnifications (Mag), it is possible to calculate the minimum resolvable angular structure size within the radiant intensity profile. This is reported as Δn resel (the angular resolution element) in Table 1. Thus, for Design 1 (see Table 1) operating in a machine with Mag=4, the imaging capability of the ISIO allows the radiant intensity, $$\frac{dE}{do}(nx, ny),$$

to be resolved at the Δn=0.008 level. If a source with nominal numerical aperture $NA_S=0.3$ is being interrogated, then there will be $NA_S/\Delta n=0.3/0.008=75$ resolution elements across the image of the source as projected onto the reticle face RF and ultimately to the wafer, W, that does the final image recording. For comparison, the pinhole method of the aforementioned U.S. Pat. No. 6,356,345 with pinhole diameter of 175 μm and aperture plate standoff distance of 5 mm has a factor ~17× less resolution.

Another factor that must be taken into account is the gain, G, of the lens. The gain G represents the gain in average intensity due to lens L and aperture stop AS over the case of a blank reticle (no lens L or aperture stop AS). Thus, if I is the light intensity (energy per unit area) reaching the wafer without MFISIO, then G*I is the light intensity reaching the wafer with MFISIO. A gain of G<1 means the MFISIO has diminished the intensity. The gain G will depend on the nominal illumination profile (e.g., small/large sigma conventional illumination) and, for that reason, a minimum/maximum (Gmin/Gmax) is listed in Table 1. Design 2 and Design 3 (see Table 1) have four and nine times higher gain, respectively, than the gain of Design 1. It should be appreciated that too high a gain can result in difficulty achieving such low doses on the machine, however, this can be remedied by a partially reflective dielectric coating on the lens top LT. Since the gain G can always be diminished by these means, large G values should not present a design limit.

Another design point, referring to FIG. 1, with a chrome opening CO in a chrome coating on the reticle face RF, is large enough to allow the entire source as represented by the marginal imaging point MIP of FIG. 5 to pass. One of the main reason for keeping some chrome coating is to reduce stray light reflection off of the reticle.

Figure 4:
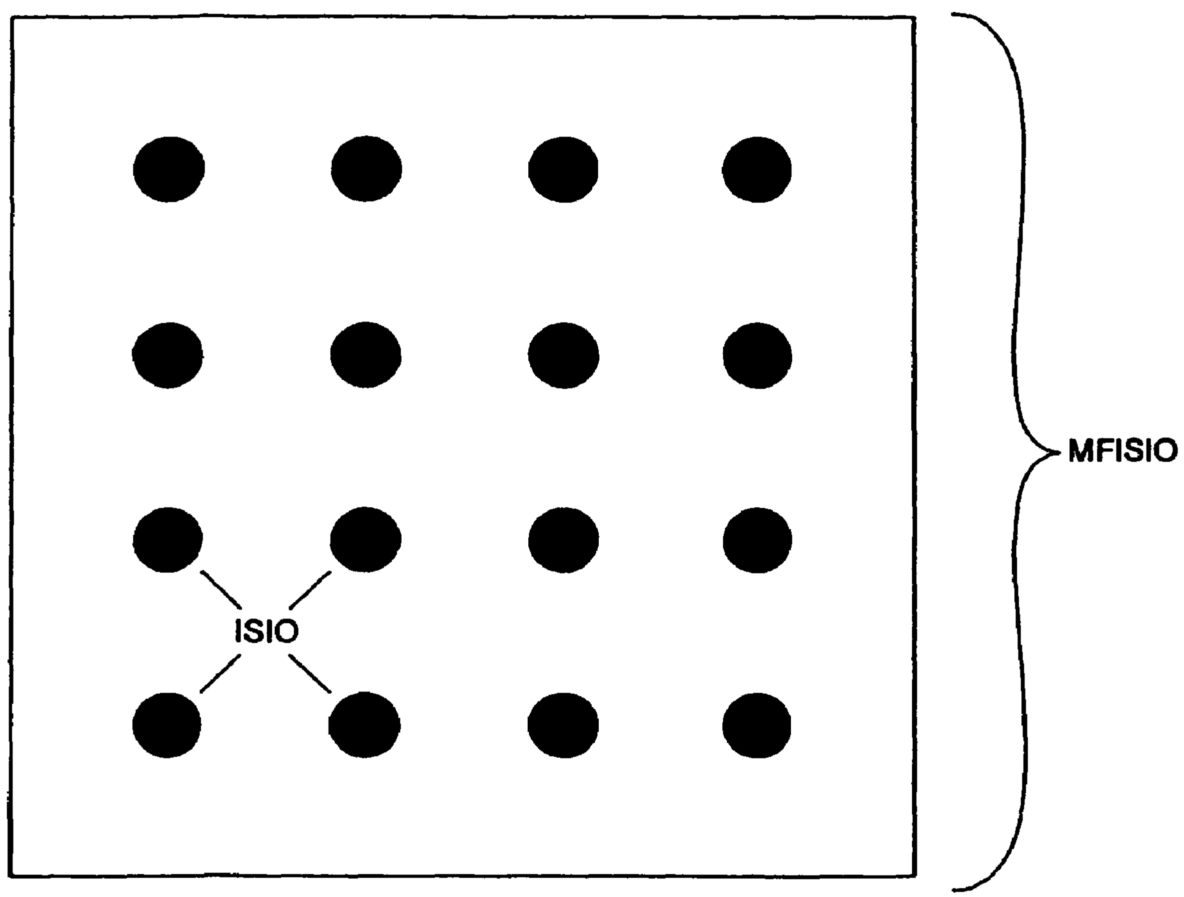
FIG. 4 shows plan view of multiple field in-situ imaging objective.

In plan view, the MFISIO of FIG. 1 is shown in FIG. 4, where each ISIO is represented by a solid circle.

Second Main Embodiment

The second main embodiment is substantially the same as the first main embodiment, except that the lens bottom (LB in FIG. 1) is fabricated to contain a high diffraction efficiency computer generated hologram (CGH), or aspheric surface. Three specific design examples in $SiO_2$ λ=248.5 μm are delineated in Table 2, which shows exemplary designs for the second main embodiment. Aspheric coefficients (a1, a2, a3) describe the phase shift (in units of microns) required of the CGH or asphere as:

$$\Phi(r)=a1*r^2+a2*r^4+a3*r^6 \quad \text{(Equation 2)}$$

where r is the radial distance from the optical axis OA on the lens bottom LB. The reason for doing this is to improve resolution (decrease Δn resel). Thus, comparing Design 6 of Table 2 with Design 3 of Table 1 (same $R_a$ and nominal lens focal length) the resolution improvement is ~2×.

TABLE 2

Exemplary Designs for Single Field ISIO of second Embodiment. λ = 248.5 nm

| Design | Ra [mm] | RL [mm] | CL [mm] | AG [mm] | RT [mm] | a1 [μm/mm$^2$] | a2 [μm/mm$^4$] | a3 [μm/mm$^8$] | Δn resel Mag = 4 | Δn resel Mag = 5 |
|---|---|---|---|---|---|---|---|---|---|---|
| 4 | 0.1 | 1.9817 | 2.1 | 0.17 | 3.81 | 3 | 27.5 | | | |
| 5 | 0.2 | 1.9751 | 2.1 | 0.17 | 3.81 | 6 | 27 | | | |
| 6 | 0.3 | 1.9755 | 2.1 | 0.17 | 3.81 | 3 | 28 | 1 | 0.010 | 0.012 |

Third Main Embodiment

Figure 8:
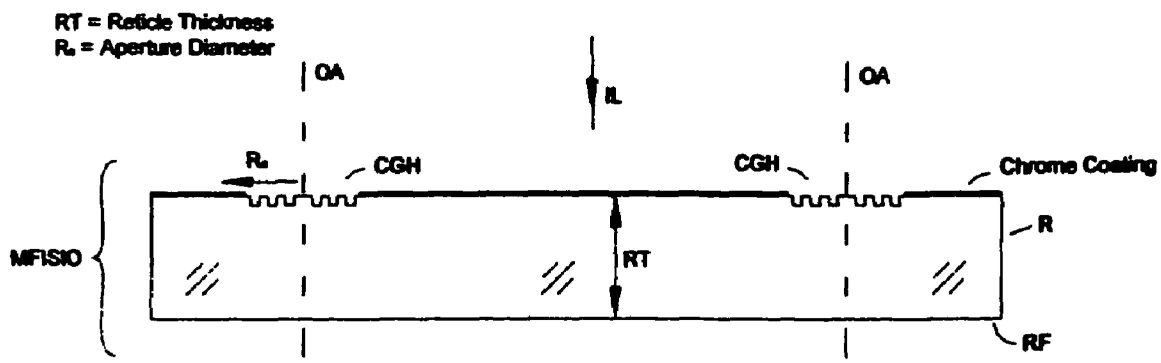
FIG. 8 shows exemplary hardware for the third main embodiment and optical parameter designations.

The third apparatus embodiment (FIG. 8) of the MFISIO includes individual ISIOs that are computer generated holograms (CGH) that image the source onto the reticle face RF. The CGH can be fabricated by standard methods onto reticle R. See, for example, "*Binary Optics Technology; The Theory and Design of Multi-Level Diffractive Optical Elements*", G. Swanson, *Lincoln Laboratory Technical Report* 854, August 1989. Typically, eight or more discrete phase levels would be utilized (only two are shown in FIG. 8).

The design of the phase profile will be specified as in Equation 2 but with a3=0. Sample design parameters are shown in Table 3 for λ=248.5 μm in fused silica. Table 3 shows exemplary designs for the third main embodiment. Instead of the discrete level CGHs of "Binary Optics Technology; The Theory and Design of Multi-Level Diffractive Optical Elements", supra, continuous aspheres could be fabricated, as described in "General Aspheric Refractive Micro-Optics Fabricated by Optical Lithography Using a High Energy Beam Sensitive Glass Gray-Level Mask, W. Dashner et al., *Journal Vacuum Science Technology*, B(14)6, 3730:3733, November/December 1996).

TABLE 3

Exemplary Designs for Single Field ISIO of 3rd Embodiment. $\lambda = 248.5$ nm

| Design | $R_a$ [mm] | RT [mm] | a1 [$\mu$m/mm$^2$] | a2 [$\mu$m/mm$^4$] |
|---|---|---|---|---|
| 7 | 0.1 | 6.35 | −117.93 | 38.57 |
| 8 | 0.2 | 6.35 | −116.57 | 3.2 |
| 9 | 0.3 | 6.35 | −116.40 | |

Fourth Main Embodiment

Figure 9:
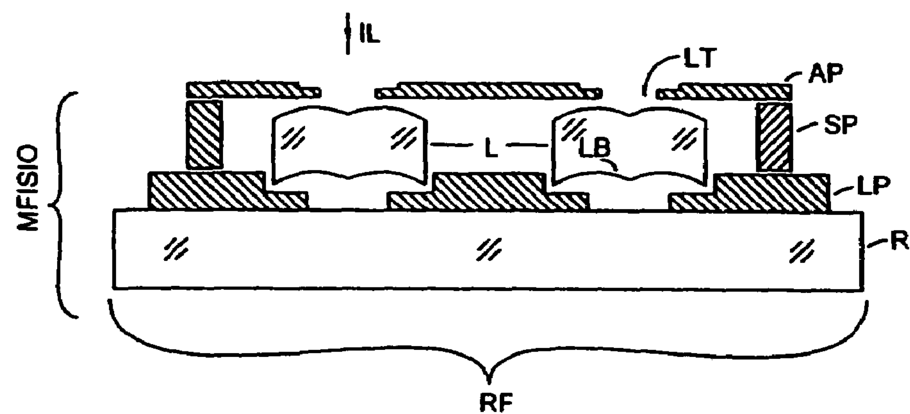
FIG. 9 shows exemplary hardware for the fourth main embodiment.
Figure 10:
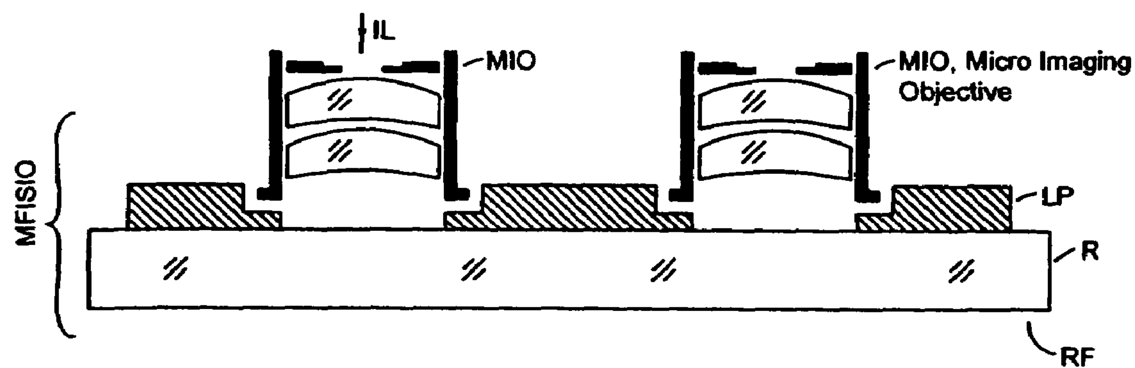
FIG. 10 shows exemplary hardware for the fifth main embodiment for MFISIO.

In this embodiment, shown in FIG. 9, the lens top LT and lens bottom LB are general aspheric of CGH elements designed to maximize source resolution.

Fifth Main Embodiment

Figure 11:
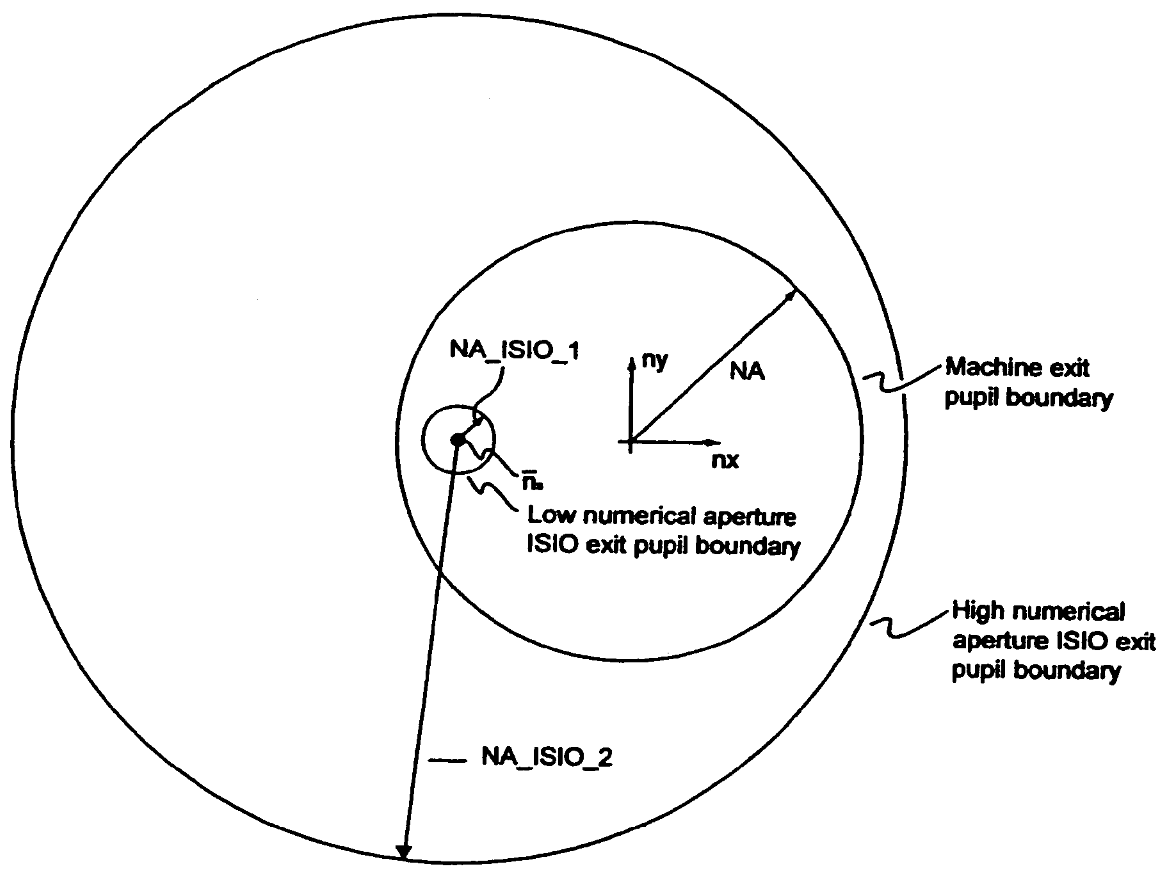
FIG. 11 illustrates mapping of ISIO exit pupil boundary onto machine exit pupil.

In this embodiment, the MFISIO has ISIOs that are multi-element micro imaging objectives (MIO) attached to a lens plate LP, which is attached to a reticle R. While more complex than previous embodiments, the MIOs allow for greater resolution and higher ISIO numerical apertures (NA_ISIO). FIG. 11 shows the mapping of the ISIO exit pupil onto the machine exit pupil. There the portion of the source corresponding to direction cosine $\bar{n}=\bar{n}_s$ as imaged by a low numerical aperture ISIO (=NA_ISIO__1) and high numerical aperture ISIO (=NA_ISIO__2) is shown superimposed on the machine exit pupil (=NA). ISIO numerical aperture is mapped to machine exit pupil by:

*NA_ISIO=NA_ISIO*|reticle side**Mag* (Equation 3)

where:

NA_ISIO|reticle side=exit numerical aperture of ISIO objective on the reticle side Mag=machine reduction magnification (typically 4 or 5).

Now machine exit pupil transmission T(nx,ny) and size, NA, influences the recorded intensity at the wafer plane approximately in proportion to the convolution of the ISIO mapped exit pupil and T(nx,ny). So this effect is quantified by a source point dependent correction factor given approximately by:

$$C(\overline{ns}) = \int \frac{d^2 n}{A} T(\bar{n}) Ⓗ (|\bar{n} - \bar{n}_s| < \text{NA\_ISIO}) \quad \text{(Equation 4)}$$

where:

$\bar{n}$=(nx,ny)=transverse direction cosine coordinate

NA_ISIO=mapped ISIO numerical aperture per Equation 3

A=$\pi$NA_ISIO$^2$

T($\bar{n}$) machine exit pupil transmission (=0 outside of machine exit pupil)

Ⓗ( )=1/0 when condition in parenthesis is true/false.

Referring to FIG. 11, for the high numerical aperture case (NA_ISIO__2>2*NA) (Equation 5), the correction factor C in Equation 4 will not depend on $\overline{ns}$; so there is essentially no correction required. For the low numerical aperture case (NA_ISIO__1)C($\overline{ns}$) will depend more strongly on T($\bar{n}$). So the advantage gained at larger ISIO numerical apertures (though not necessarily as large as given by Equation 5) will be the increased decoupling of exit pupil size and transmission in reconstructing the radiant intensity (vide infra).

Sixth Main Embodiment

Figure 12:
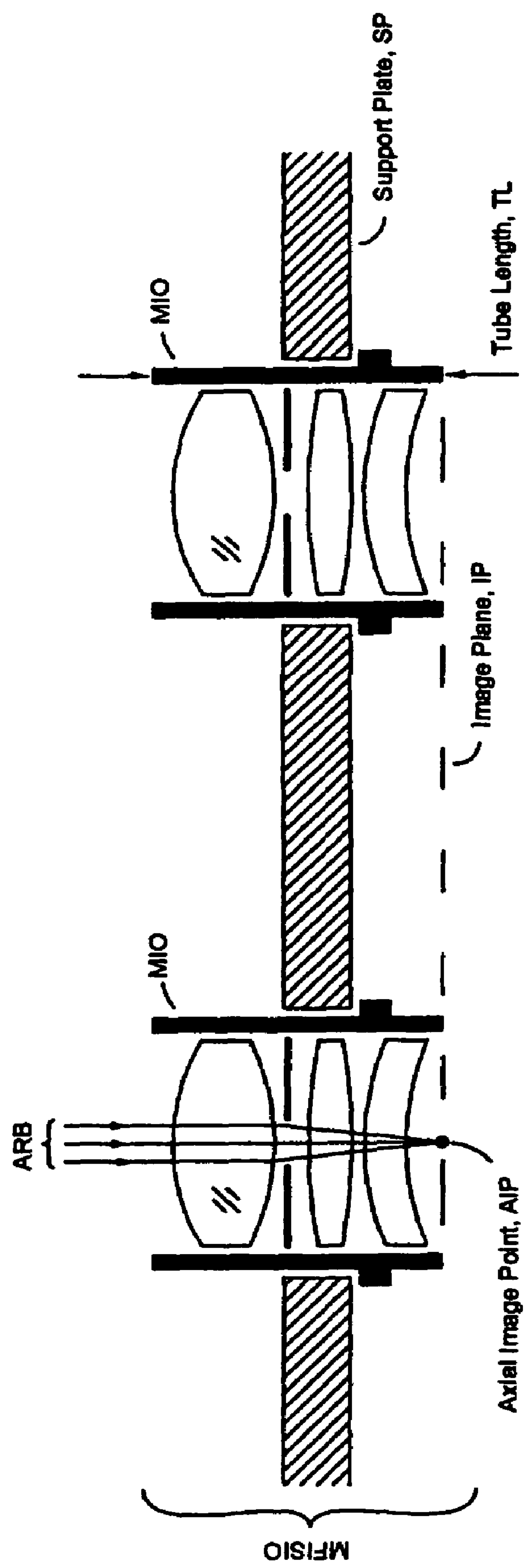
FIG. 12 shows exemplary hardware for the sixth main embodiment.

Shown in FIG. 12, this embodiment is very similar to the fifth embodiment except that instead of mounting micro imaging objectives MIO to a reticle, they are mounted to a support plate SP that allows for a longer MIO tube length TL, permitting greater MIO design flexibility.

Seventh Main Embodiment

Figure 13:
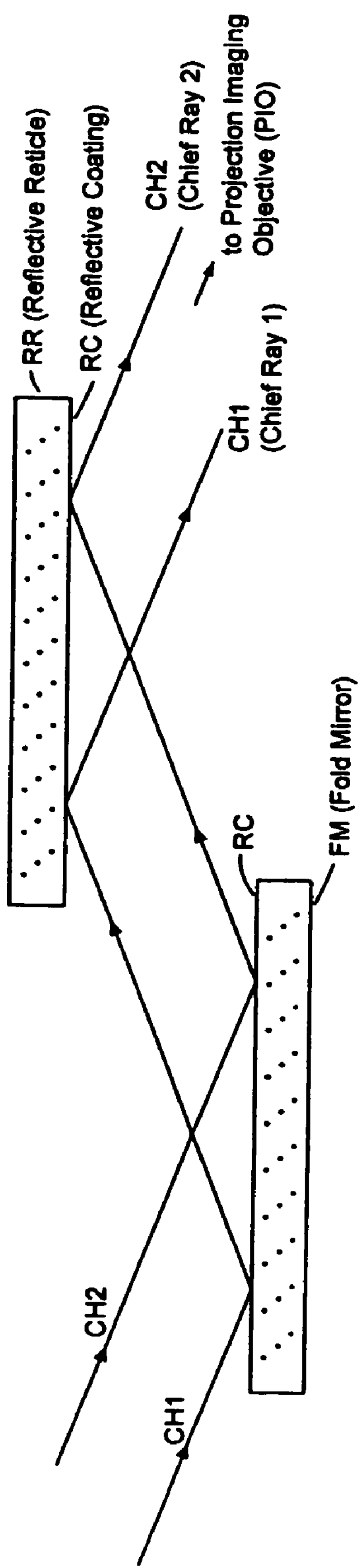
FIG. 13 shows schematic of portion of EUV reflective beamtrain.
Figure 14:
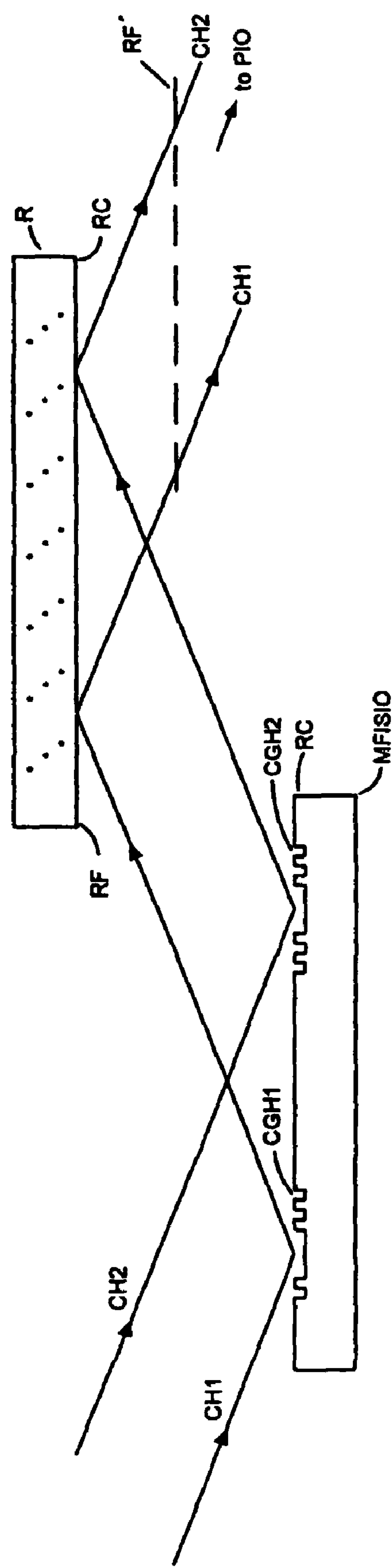
FIG. 14 shows exemplary hardware for the seventh and eleventh main embodiments.

This embodiment applies to machines utilizing reflective masks in particular to extreme ultraviolet (EUV) systems. See, for example, "Reduction Imaging at 14 nm Using Multilayer-Coated Optics: Printing of Features Smaller than 0.1 Micron", J. Bjorkholm et al., *Journal Vacuum Science and Technology*, B 8(6), 1509:1513, November/December 1990; "Development of XUV Projection Lithography at 60–80 nm", B. Newnam et al., *SPIE*, Vol. 1671, 419:436, 1992; "EUV Lithography—The Successor to Optical Lithography", J. Bjorkholm; "Four-Mirror Extreme Ultraviolet (EUV) Lithography Projection System", S. Cohen, U.S. Pat. No. 6,142,641, 2000. In a schematic reflective beamtrain, FIG. 13, chief rays CH1 and CH2 from an illuminator beamtrain (not shown) are incident on a fold mirror (FM) that is part of the illuminator beamtrain and then incident on a reflective reticle RR that contains a reflective coating RC, whose reflectivity is modulated to create the desired circuit pattern. After reflecting off of RR, the light is then incident on projecting imaging objective PIO and wafer W (neither shown). Referring to FIG. 14, if the fold mirror FM is replaced with the MFISIO consisting of ISIOs that are computer generated holograms (CGH1, CGH2) in phase, each CGH imaging the source onto the reflective coating RC of reticle R, and if the regions between the CGHs are blackened (made non-reflective), the source can be nominally directly imaged onto the wafer. Aspheres fabricated with the method of "General Aspheric Refractive Micro-Optics Fabricated by Optical Lithography Using a High Energy Beam Sensitive Glass Gray-Level Mask", supra, could also be used to create the required ISIOs.

Eighth Main Embodiment

Figure 15:
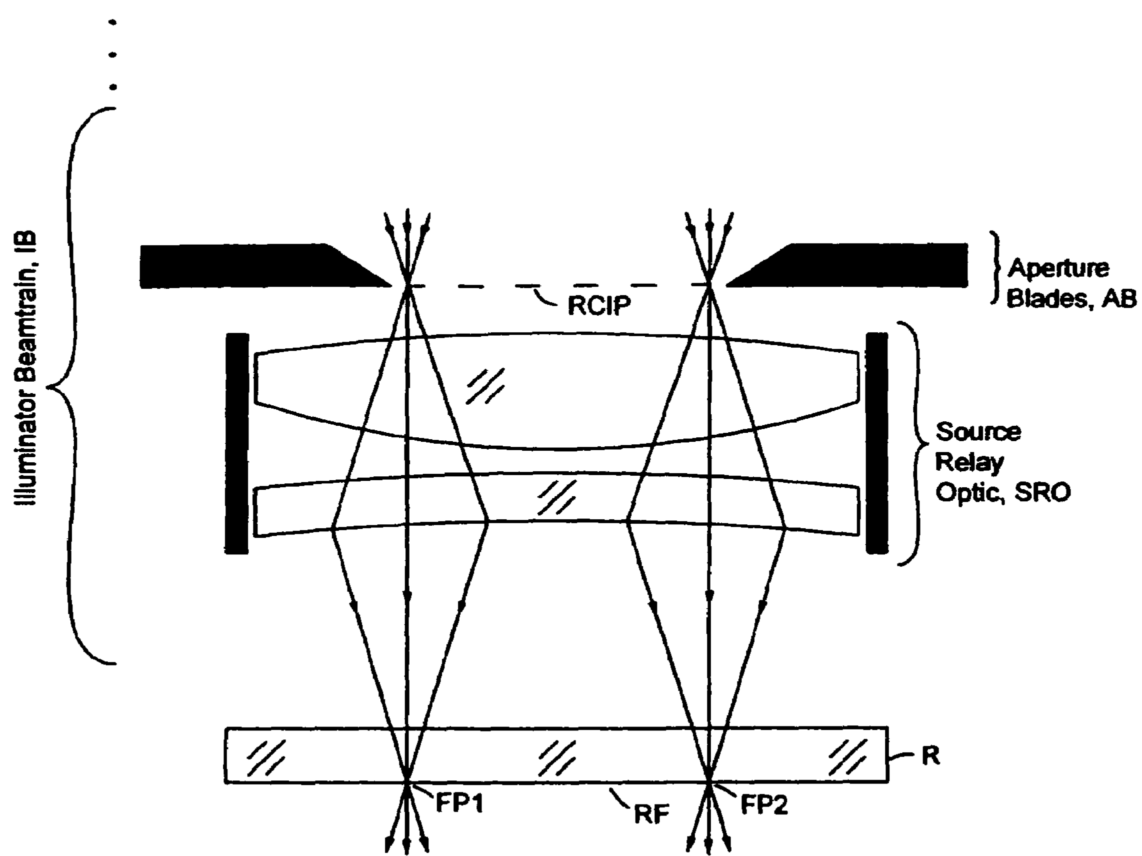
FIG. 15 shows schematic hardware arrangement for relaying source conjugate plane to reticle face.

Having described an arrangement (seventh embodiment) where the MFISIO does not fit into a reticle/pellicle form factor, another will now be described. Referring to FIG. 15, a schematic of a portion of a generic illuminator beamtrain IB shows aperture blades AB that are located in a reticle conjugate image plane, RCIP. The RCIP is imaged by a source relay optic SRO through a reticle R onto a reticle face RF. The function of AB and SRO is to allow machine user selection of size and location of portion of reticle face RF, requiring exposure.

Figure 16:
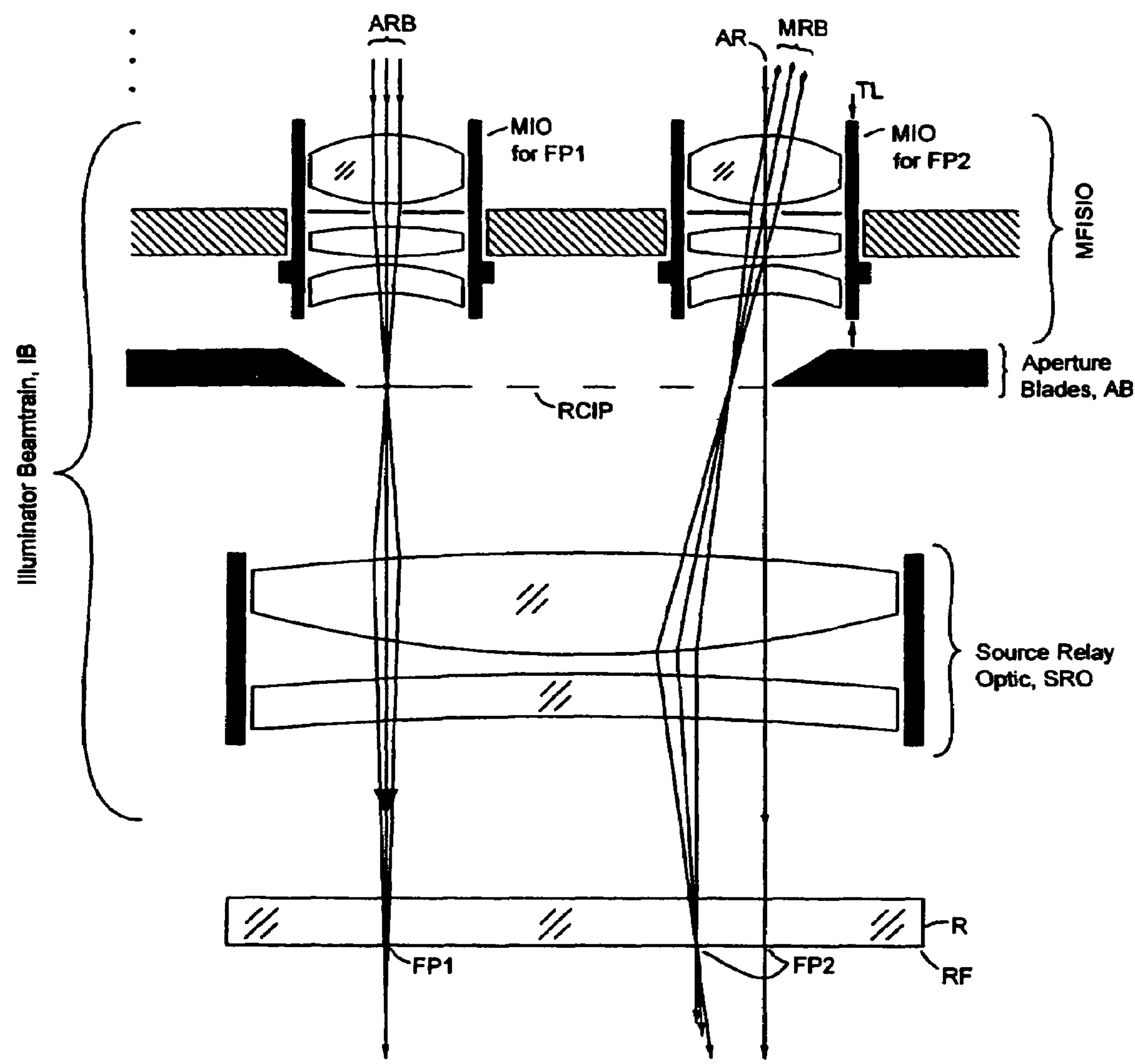
FIG. 16 shows exemplary hardware and arrangement of same in machine beamtrain for the eighth main embodiment.

Referring to FIG. 16, MFISIO with micro imaging objective (MIO), ISIO is inserted in an illuminator beamtrain at a point upstream from the aperture blade RCIP and at such a position that the imaging surface for the MFISIO coincides with the RCIP. Then the source relay optic SRO will image source images formed at the RCIP onto the reticle face RF.

An advantage of this arrangement is the ability to use longer tube length (TL) MIOs because of relaxed spatial constraints. In particular, designs close to standard UV, low to modest numerical aperture (NA_ISIO|reticle <≈0.25–0.5) microscope objectives, can be used.

Ninth Main Embodiment

Figure 17:
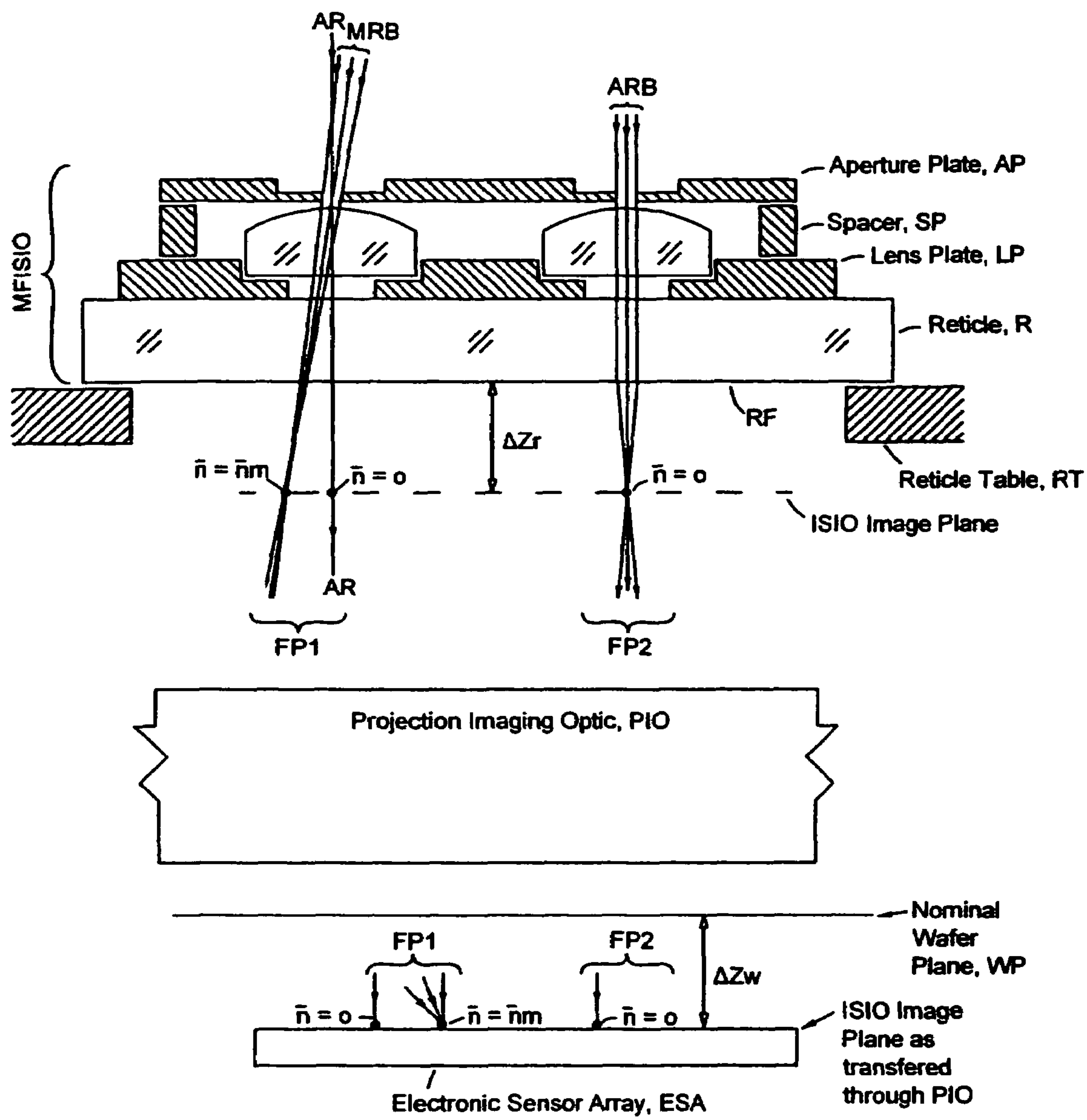
FIG. 17 shows exemplary hardware and arrangement of same in machine beamtrain for the ninth main embodiment.
Figure 18:
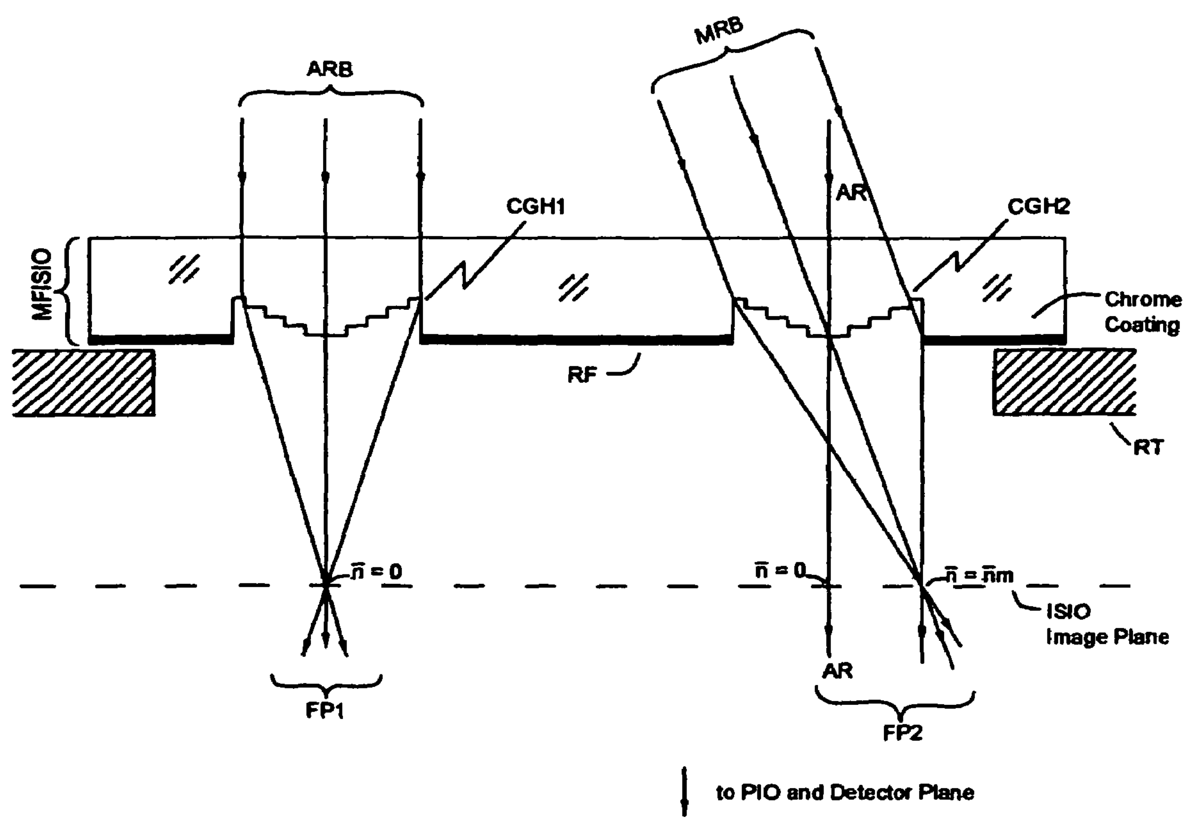
FIG. 18 shows the tenth main embodiment hardware and arrangement of same in machine beamtrain.

This embodiment utilizes an MFISIO of the type described in connection with the first, second, or fourth embodiments, but now instead of imaging the source onto the reticle face, it is imaged beyond the reticle face. In FIG. 17, the MFISIO has individual ISIOs that have a common plane, an ISIO image plane, where the source is imaged a distance ΔZ from the RF. The projection imaging optic, PIO, images the reticle face RF to a nominal wafer plane WP, where the wafer top surface is nominally placed. The PIO will image the ISIO image plane to distance given by:

$$\Delta ZW \approx \Delta Z_r/Mag^2 \quad \text{(Equation 6)}$$

below WP. There, an electronic sensor array ESA records the source images either one field point at a time (e.g., FP1 measured in one series, FP2 in another series) or several at once (FP1, FP2 simultaneously recorded at different portions of ESA array). The ESA will typically be embedded in the wafer stage chuck and moved into appropriate position where measurements are required.

Tenth Main Embodiment

This is generally the same operation and use pattern as in the ninth embodiment but now MFISIO is a reticle whose ISIOs are multi-level CGH written on reticle face RF and image the source to a plane below the RF. Aspheres could be used in place of the CGHs. See, for example, "General aspheric Refractive Micro-Optics Fabricated by Optical Lithography Using a High Energy Beam Sensitive Glass Gray-Level Mask", W. Dashner et al., *Journal Vacuum Science Technology*, B(14)6, 3730:3733, November/December 1996.

Eleventh Main Embodiment

The MFISIO is similar to the seventh embodiment, except that the source image lies in the plane beyond the reticle face RF. An electronic sensor array embedded in the wafer chuck records images, as in the ninth embodiment. Thus, and referring to FIG. 14, CGH1 and CGH2 of the MFISIO would image the source onto imaginary plane RF which is optically after reticle face RF.

Further Variations on the Main Embodiments

Figure 22:
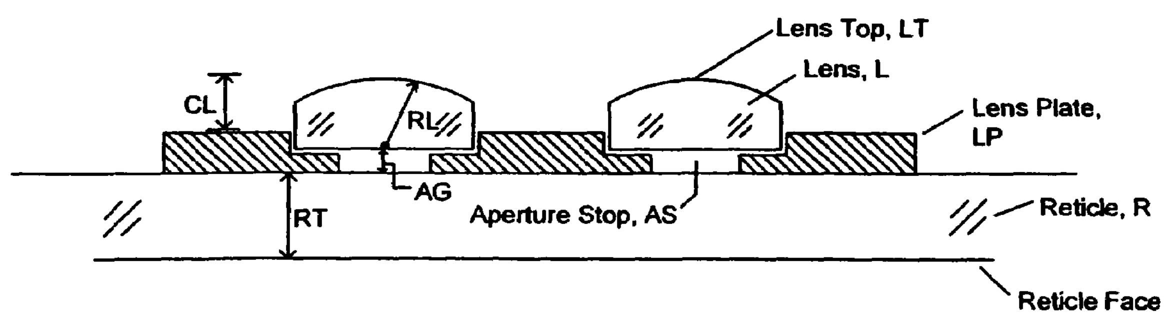
FIG. 22 illustrates an alternative variation to the first embodiment.

FIG. 22 shows another variation on the 1$^{st}$ embodiment. There the aperture stop, AS, is located between lens L and reticle R on lens plate LP. This can be constructed advantageously if lens center thickness CL and lens radius of curvature, RL are approximately equal. Then the aperture stop is concentric with lens L, the coma is minimized, and the spherical aberration induced by the convex lens top, LT, will be constant with input ray (source or object) angle. This constant spherical aberration can then be compensated by adjusting lens thickness, CL slightly. Exemplary design parameters for λ=248.4 nm and fused silica lens and reticle material are, RL=2.12 mm, CL=2.1 mm, AG=0.18 mm, RT=3.81 mm with a 0.2 mm diameter aperture stop, AS.

Figure 23:
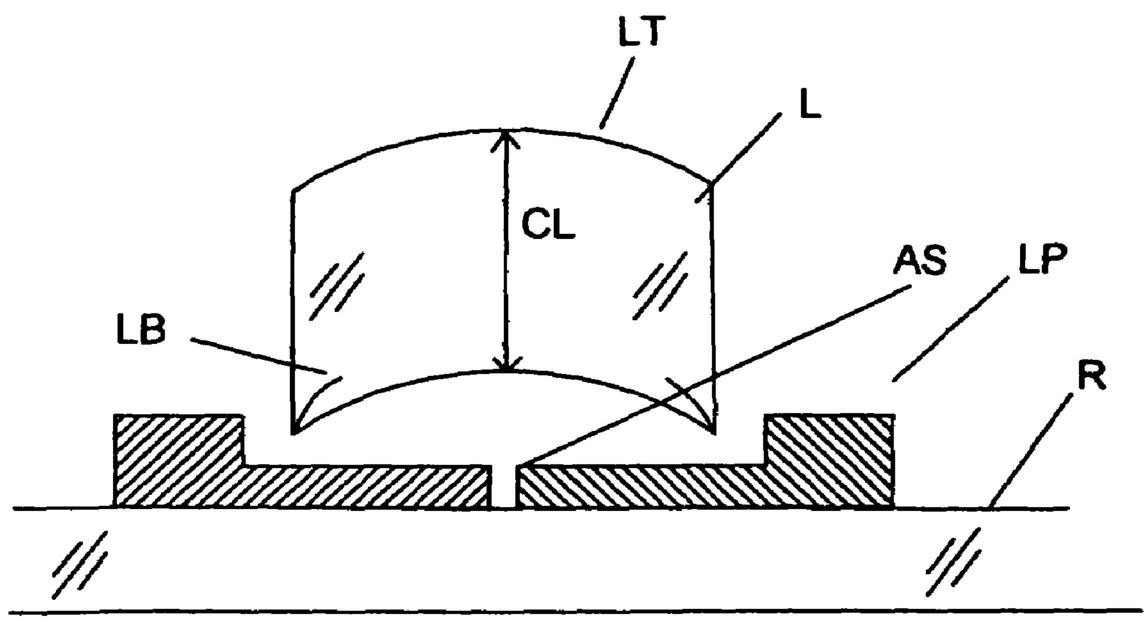
FIG. 23 illustrates an alternative variation to the fourth embodiment.

In another variation of this, but applied to the 4$^{th}$ main embodiment, and referring to FIG. 23, aperture stop AS is again located in lens plate LP. If the lens center thickness CL is approximately the same as its radius of curvature, we have a concentric system and the remarks above concerning minimizing coma and constant spherical aberration apply. But, now, since lens top LT and especially lens bottom, LB, can be aspherized or simply have their curvature adjusted, we can more easily compensate for spherical aberration and thereby improve resolution.

Figure 24:
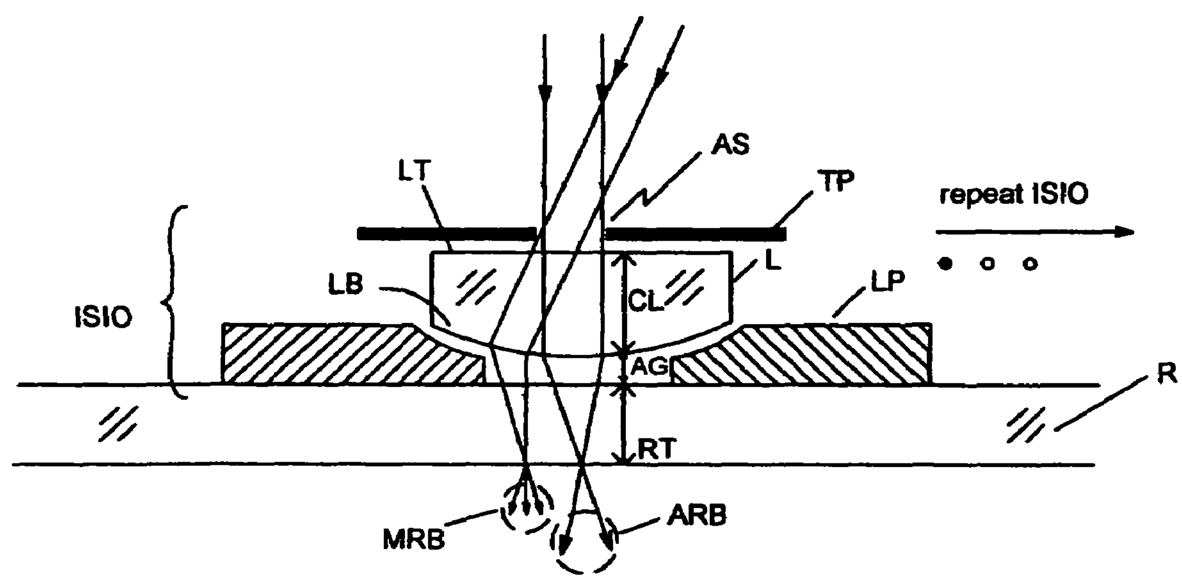
FIG. 24 illustrates yet another alternative variation to the first embodiment.

FIG. 24 shows yet another variation of the 1$^{st}$ main embodiment that allows for telecentric or substantially telecentric operation of in-situ imaging objective, ISIO. Aperture stop, AS, is located in lens top plate, TP, but lens top, LT, is flat while lens bottom, LB, is convex and contains all of the optical power. For telecentric operation, we would have the following paraxial relations:

$$\frac{CL}{n} = \frac{RL}{n-1} \quad \text{(Equation 7)}$$

$$\frac{RT}{n} + AG = \frac{RL}{n-1} \quad \text{(Equation 8)}$$

where

CL=lens center thickness n=lens/reticle index of refraction

RL=lens radius of curvature

AG=air gap thickness

RT=reticle thickness

Figure 25:
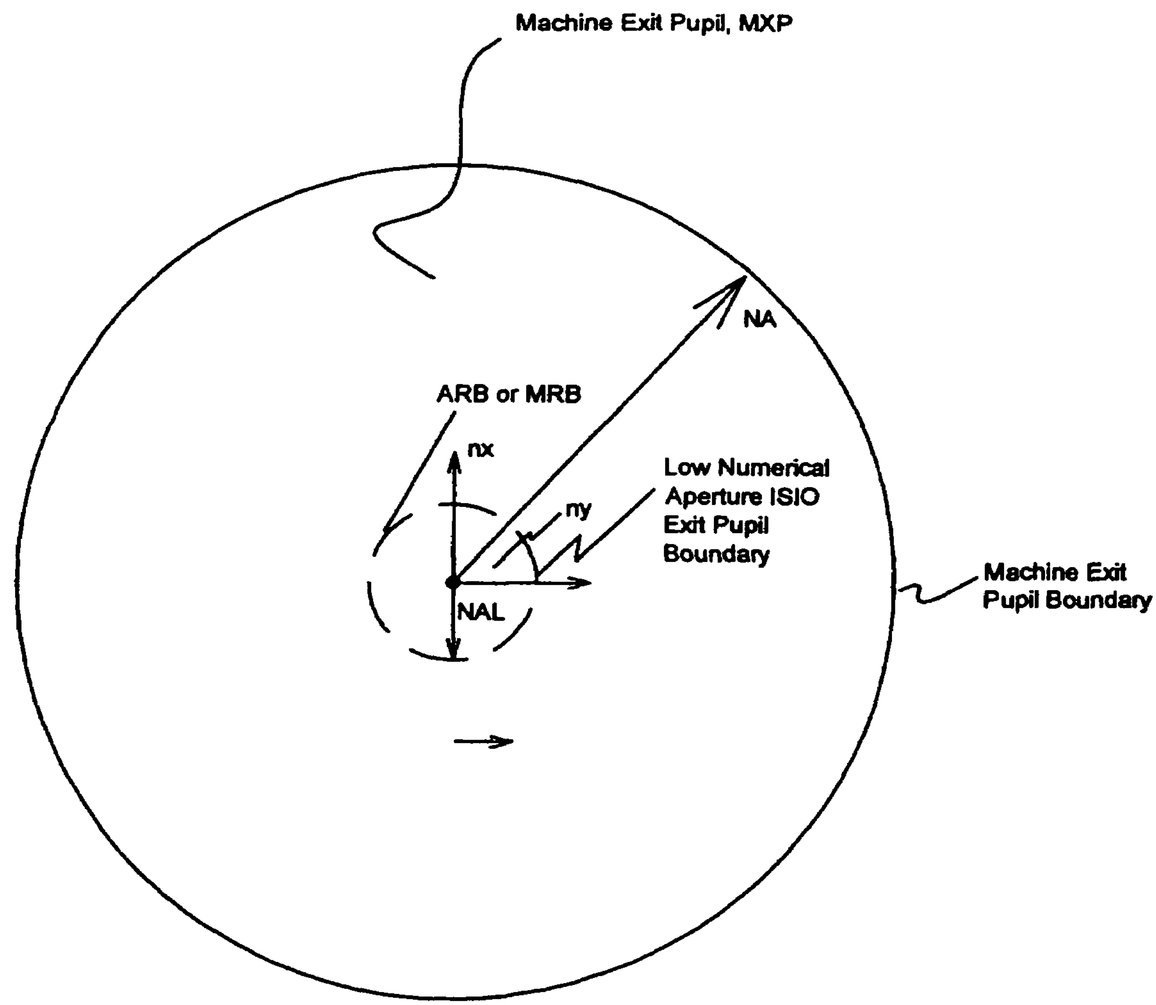
FIG. 25 is a diagram illustrating marginal ray bundles within an exit pupil of an embodiment.

In practice, CL, RT, AG, RL would be slightly adjusted to minimize aberrations. With this arrangement, axial ray bundle, ARB of FIG. 24, and marginal ray bundle MRB of FIG. 24, pass through the same portion of machine exit pupil MXP of FIG. 25. One consequence of telecentric operation is that exit pupil correction factor C of Equation 4 does not vary with source position, $\overline{ns}$, and can therefore be eliminated from consideration. A more significant consequence is that telecentric imaging objectives allow sources of size NAs greater than the machine exit pupil size, NA, to be measured (e.g., sources with sigma >1 can be analyzed).

Figure 26:
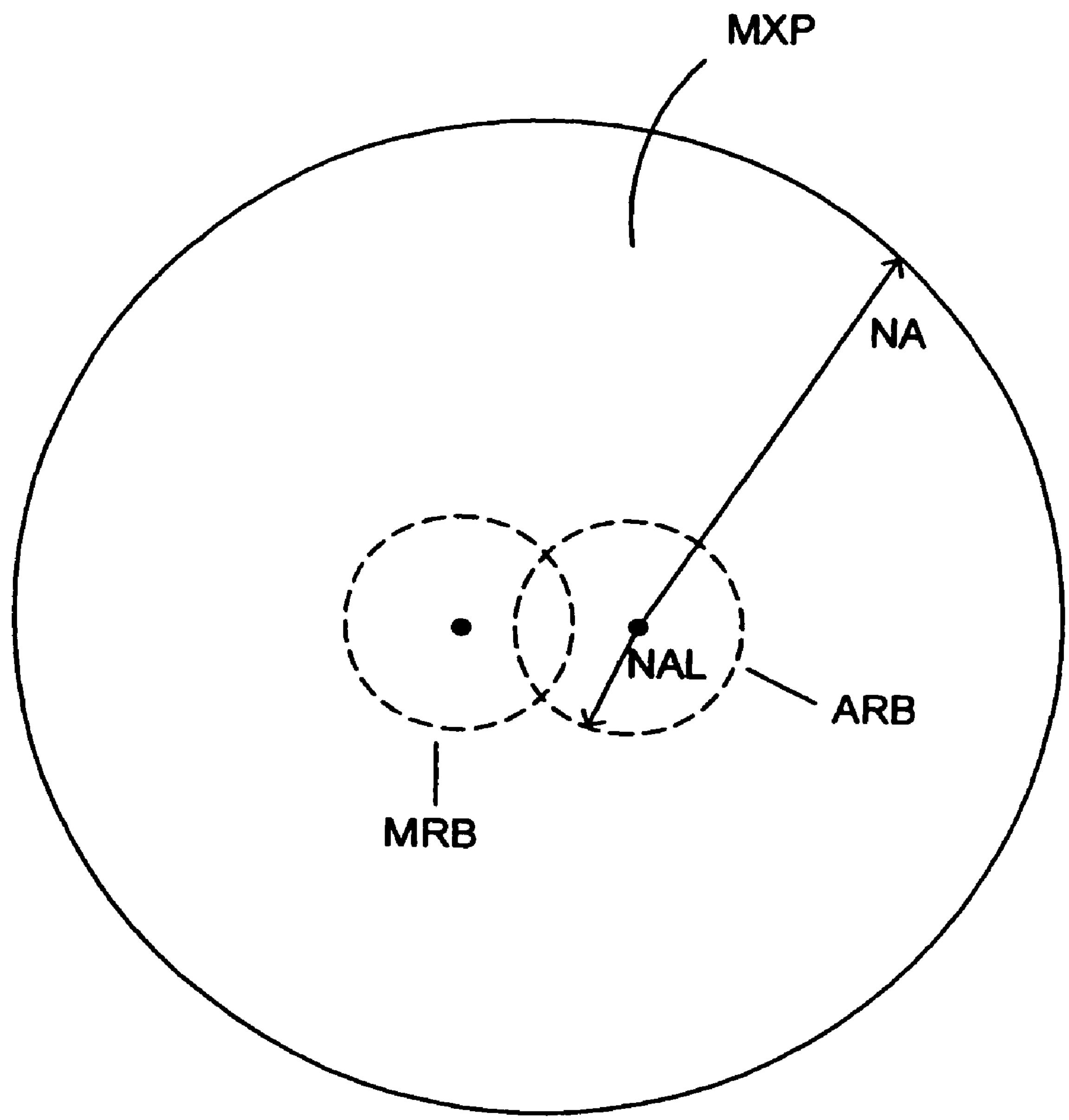
FIG. 26 is a diagram illustrating marginal ray bundles within an exit pupil of another embodiment.

To the extent that the telecentric constraints of Equations 7 and 8 do not provide sufficient imaging resolution, they can be relaxed so that (FIG. 26) marginal ray bundle MRB and axial ray bundle ARB while not coinciding, stay well within the machine exit pupil, MXP, even at sigma <1 conditions. In this case, correction factor C of Equation 4 will vary and needs to be used for precise correction but to the extent that ARB and MRB stay within the exit pupil boundary, these corrections are relatively minor.

Resist Recording Media

Figure 19:
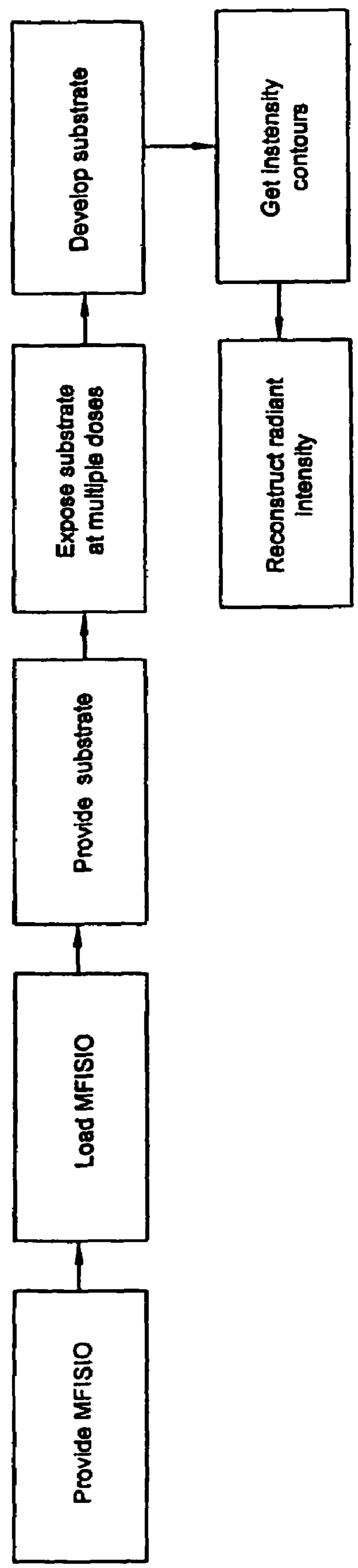
FIG. 19 shows process for measuring radiant intensity with photo resist covered substrates.
Figure 21:
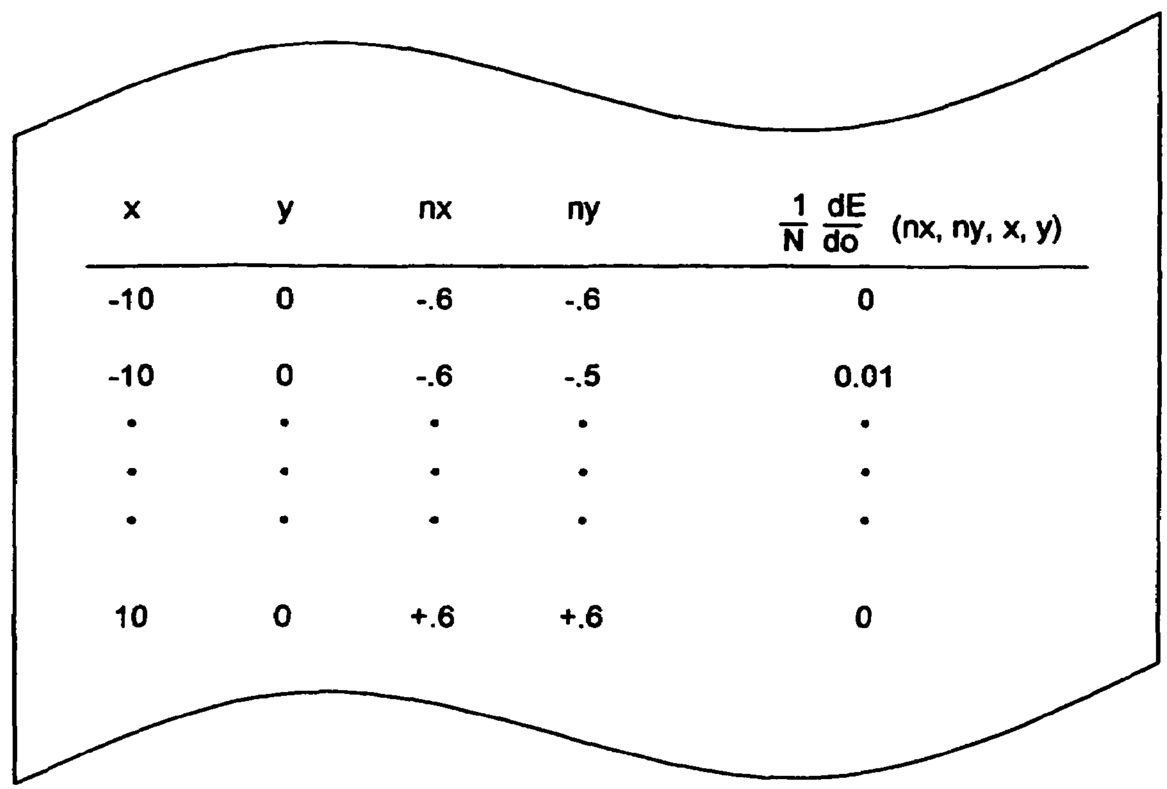
FIG. 21 shows final result of method of this invention normalized radiant intensity at multiple discrete field points (x,y).

When recording the source images in photoresist on a wafer, the process flow of FIG. 19 is used. First an MFISIO as described herein is provided and loaded onto the machine we are characterizing. Next a resist coated substrate (wafer) is provided and loaded on the machine. Next, the substrate is exposed at multiple, increasing exposure doses at discretely separated image fields on a wafer See, for example, page 3 of "Examples of Illumination Source Effects on Imaging Performance" by A. J. de Ruyter et. al. in 2003 ARCH Chemicals Microlithography Symposium, supra. The substrate is then developed and the exposed images are photographed one by one. From these images and knowledge of the exposure dose sequence, the 'raw' intensity contours of dE/do(nx,ny) are obtained. Next these intensity contours are computationally overlapped and the radiometric and the exit pupil transmission correction factor (Equation 4) are applied to reconstruct the normalized radiant intensity (FIG. 21):

$$R(nx, ny; x, y) = \frac{1}{N}\frac{dE}{do}(nx, ny; x, y) \quad \text{(Equation 9)}$$

where:

$$N = \int do_{\vec{n}} \frac{dE}{do}(nx, ny; x, y) \text{ the normalization} \quad \text{(Equation 10)}$$

where:

$$\frac{dE}{do}(nx, ny)$$

Electronic Recording Media

Figure 20:
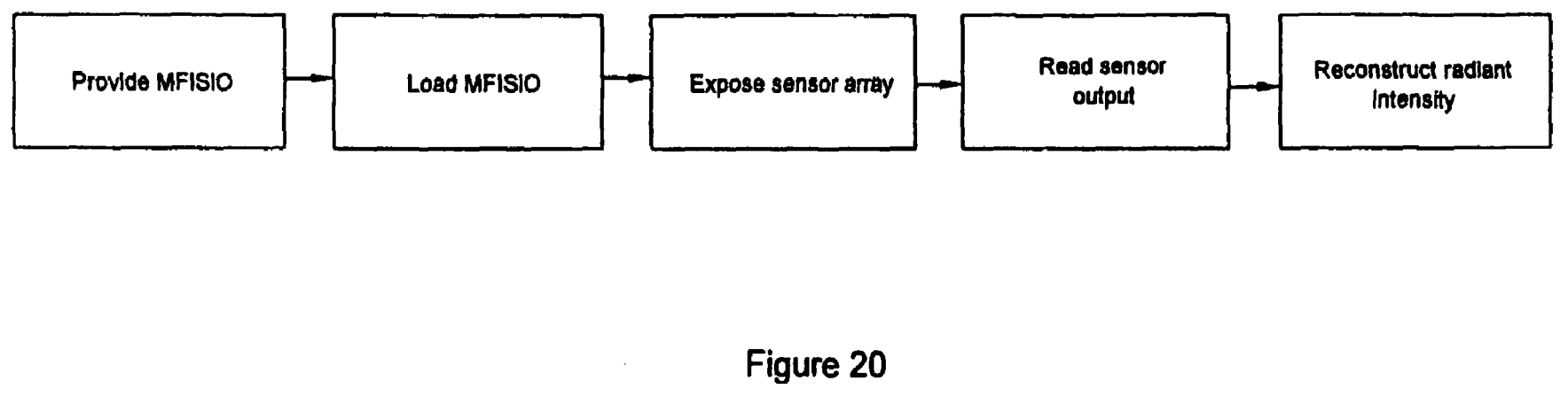

If images are recorded electronically (e.g., on a CCD array) instead of in photoresist, the steps outlined in FIG. 20 would be followed. The major difference with the previous method is that recorded sensor output directly provides the "raw" intensity or signal for the radiant intensity. Applying any gain offsets or mappings, radiometric (e.g., angle dependant corrections) and exit pupil transmission factor corrections (Equation 4) are performed to get the normalized radiant intensity (see Equations 9 and 10, FIG. 21).

Variations of the Main Embodiments

A number of variations of the embodiments described above are possible.

In all of the MFISIO designs, image distortion is not a significant design constraint since to the extent it is known (vis a vis its design value) it can be compensated for, as will be known to those skilled in the art.

The present invention has been mainly described with respect to its application on the projection imaging tools (e.g., scanners) commonly used in semiconductor manufacturing today. See, for example, "Micrascan(™) III Performance of a Third Generation, Catadioptric Step and Scan Lithographic Tool", D. Cote et al., *SPIE*, Vol. 3051, 806:816, 1997; "ArF Step and Scan Exposure System for 0.15 Micron and 0.13 Micron Technology Node", J. Mulkens et al., *SPIE*, Conference on Optical Microlithography XII, 506:521, March 1999; "0.7 NA DUV Step and Scan System for 150 nm Imaging with Improved Overlay", J. V. Schoot, *SPIE*, Vol. 3676, 448:463, 1999. The methods of the present invention can be applied to other scanning projection tools, such as: two-dimensional scanners (see, for example, "Large Area Fine Line Patterning by Scanning Projection Lithography", H. Muller et al., *MCM* 1994 *Proceedings*, 100:104; "Large-Area, High-Throughput, High-Resolution Projection Imaging System", Jain, U.S. Pat. No. 5,285,236 issued Feb. 8, 1994), office copy machines (see, for example, "Projection Optical System for Use in Precise Copy", T. Sato et al., U.S. Pat. No. 4,861,148, Aug. 29, 1989), and next generation lithography (ngl) systems such as XUV (see, for example, "Development of XUV Projection Lithography at 60–80 nm", supra), SCALPEL, EUV (Extreme Ultra Violet—"Reduction Imaging at 14 nm Using Multilayer-Coated Optics: Printing of Features Smaller than 0.1 Micron" supra), IPL (Ion Projection Lithography), EPL (electron projection lithography—see, for example, "Mix-and-Match: A Necessary Choice", R. DeJuse, *Semiconductor International*, 66:76, February 2000), and X-ray (see, for example, "Soft X-ray Projection Lithography", N. Ceglio et al., *J. Vac. Sci. Technol. B* 8(6), 1325:1328, November/December 1990). The present techniques can also be used with immersion lithography where the optical medium above the wafer has a refractive index significantly different from air (water for example). It is also applicable to lithographic steppers. See, for example, "New 0.54 Aperture I-Line Wafer Stepper with Field by Field Leveling Combined with Global Alignment", M. Van den Brink et al., *SPIE*, Vol. 1463, 709:724, 1991; "High Throughput Wafer Steppers with Automatically Adjustable Conventional and Annular Illumination modes", supra, "Optical Lithography—Thirty Years and Three Orders of Magnitude", J. Bruning, *SPIE*, Vol. 3051, 1997; "High Numerical Aperture I-Line Stepper", B. Katz et al., 1:20, 1993. The present invention is also applicable in so-called immersion lenses (wafer in liquid).

The present invention has been mainly described with respect to the recording medium being positive photoresist. The present invention could equally well have used negative photoresist. In general, the recording medium can be whatever is typically used on the lithographic projection tool being measured. Thus, on an EPL tool, an electron beam photoresist such as PMMA could be utilized as the recording medium.

The substrates on which the recording media is placed have been described as wafers. Ordinarily, this will be the case in semiconductor manufacture. The exact form of the substrate will be dictated by the projection lithography tool and its use in a specific manufacturing environment. Thus, in a flat panel manufacturing facility, the substrate on which the photoresist would be placed would be a glass plate or panel. A mask making tool would utilize a reticle as a substrate. Circuit boards or multi-chip module carriers are other possible substrates. Additionally, wafer form factor electronic sensor arrays could be utilized in place of photoresist control wafers. See, for example, "Wafer-Mounted Sensor Arrays for Plasma Etch Processes", M. Freed.

While the present invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

We claim:

1. An apparatus for measuring radiant intensity of a photolithographic illumination source in a photolithography projection imaging system, the apparatus comprising:

a plurality of discrete imaging objectives, each capable of imaging to a corresponding field point, thereby imaging a plurality of field points; and a common imaging surface for the plurality of discrete imaging objectives, wherein each of the plurality of field points is imaged on the common imaging surface;

wherein the discrete imaging objectives have sufficient resolution such that the apparatus produces a reconstruction of a radiant intensity profile of the illumination source, and, wherein one or more of the discrete imaging objectives comprises a computer generated hologram integral with a reticle top surface.

2. An apparatus for measuring radiant intensity of a photolithographic illumination source in a photolithography projection imaging system, the apparatus comprising:

a plurality of discrete imaging objectives, each capable of imaging to a corresponding field point, thereby imaging a plurality of field points; and a common imaging surface for the plurality of discrete imaging objectives, wherein each of the plurality of field points is imaged on the common imaging surface;

wherein the discrete imaging objectives have sufficient resolution such that the apparatus produces a reconstruction of a radiant intensity profile of the illumination source and, wherein said common imaging surface comprises a reticle face.

3. An apparatus for measuring radiant intensity of a photolithographic illumination source in a photolithography projection imaging system, the apparatus comprising:

a plurality of discrete imaging objectives, each capable of imaging to a corresponding field point, thereby imaging a plurality of field points; and a common imaging surface for the plurality of discrete imaging objectives, wherein each of the plurality of field points is imaged on the common imaging surface;

wherein the discrete imaging objectives have sufficient resolution such that the apparatus produces a reconstruction of a radiant intensity profile of the illumination source, and, wherein the discrete imaging objectives can be placed in an illuminator beamtrain such that the common imaging surface lies at a reticle conjugate imaging plane.

4. An apparatus for measuring radiant intensity of a photolithographic illumination source in a photolithography projection imaging system, the apparatus comprising:

a plurality of discrete imaging objectives, each capable of imaging to a corresponding field point, thereby imaging a plurality of field points; and a common imaging surface for the plurality of discrete imaging objectives, wherein each of the plurality of field points is imaged on the common imaging surface;

wherein the discrete imaging objectives have sufficient resolution such that the apparatus produces a reconstruction of a radiant intensity profile of the illumination source, further comprising a common mounting for the plurality of imaging objectives.

5. The apparatus of claim 4, wherein the common mounting comprises a projection imaging tool.

6. The apparatus of claim 4, wherein the common mounting comprises a support plate.

7. A projection imaging system comprising:

an illuminator comprising a light source that generates a radiant intensity profile and produces an illuminator beamtrain;

a multiple field imaging objective in optical communication with the light source;

a projection imaging optic distal the multiple field imaging objective; and an electronic sensor array, wherein the multiple field imaging objective images the radiant intensity profile onto a plane optically conjugate to the electronic sensor array via the projection imaging optic with sufficient resolution such that the system produces a reconstruction of the radiant intensity profile, further comprising a reticle table that separates a reticle from the projection imaging optic.

8. A projection imaging system comprising:

an illuminator comprising a light source that generates a radiant intensity profile and produces an illuminator beamtrain;

a multiple field imaging objective in optical communication with the light source;

a projection imaging optic distal the multiple field imaging objective; and an electronic sensor array, wherein the multiple field imaging objective images the radiant intensity profile onto a plane optically conjugate to the electronic sensor array via the projection imaging optic with sufficient resolution such that the system produces a reconstruction of the radiant intensity profile, wherein the electronic sensor array comprises an imaging optic that relays the plane to the sensor array.

9. A projection imaging system comprising:

an illuminator comprising a light source that generates a radiant intensity profile and produces an illuminator beamtrain;

a multiple field imaging objective in optical communication with the light source;

a projection imaging optic distal the multiple field imaging objective; and an electronic sensor array, wherein the multiple field imaging objective images the radiant intensity profile onto a plane optically conjugate to the electronic sensor array via the projection imaging optic with sufficient resolution such that the system produces a reconstruction of the radiant intensity profile, wherein multiple field imaging objective comprises a reticle having one or more computer generated holograms written on its face.

10. A projection imaging system comprising:

an illuminator comprising a light source, a reflective substrate, and a reflective reticle, wherein the light source projects a plurality of light rays toward the reflective substrate, which reflects the light rays toward the reflective reticle; and a multiple field imaging objective in optical communication with the reflective reticle, wherein the plurality of rays are incident on the multiple field imaging objective;

wherein the multiple field imaging objectives have sufficient resolution such that the system produces a reconstruction of a radiant intensity profile of the illumination source.

11. The projection imaging system of claim 10, wherein the source image lies in a plane distal to the reticle.

12. The projection imaging system of claim 10, wherein the reflective substrate comprises a folding mirror.

13. The projection imaging system of claim 10, wherein the reflective substrate comprises one or more computer generated holograms.

14. The projection imaging system of claim 13, wherein the reflective substrate comprises at least two computer generated holograms separated by one or more non-reflective regions.

15. The projection imaging system of claim 10, wherein the reflective reticle comprises a reflective coating with modulated reflectivity.

16. A projection imaging system comprising:

an illuminator comprising a light source, a reflective substrate, and a reflective reticle, wherein an illuminator beamtrain is projected toward the reflective substrate that includes a multiple in-situ imaging objective, and is reflected toward the reflective reticle; and a common imaging surface where the radiant intensity of the beamtrain is recorded at multiple field points;

wherein the multiple in-situ imaging objectives have sufficient resolution such that the system produces a reconstruction of a radiant intensity profile of the illuminator.

17. A projection imaging system as defined in claim 16, wherein the in-situ imaging objective is a computer generated hologram.

18. A projection imaging system as defined in claim 16, wherein the in-situ imaging objective is an asphere.

* * * * *

UNITED STATES PATENT AND TRADEMARK OFFICE

CERTIFICATE OF CORRECTION

PATENT NO. : 7,088,427 B2 
APPLICATION NO. : 10/828579
DATED : August 8, 2006
INVENTOR(S) : Smith et al.

It is certified that error appears in the above-identified patent and that said Letters Patent is hereby corrected as shown below:

Column 1, line 61 to column 2, line 25, please amend as follows:

--The effect of the illumination source ~~(source)~~ when coupled to projection imaging objective (PIO, or lens that relay the reticle object plane to the wafer plane) aberrations has been documented, as has the deleterious effects of improperly or non-optimally configured sources themselves on lithographic printing. See, for example, “Differences of Pattern Displacement Error Under Different Illumination Conditions”, N. Seong et al., *SPIE*, Vol. 3334, 868:872, 1998; “Effect of Off-Axis Illumination on Stepper Overlay”, N. Farrar, *SPIE*, Vol. 2439, 273:275, 1995; “Overlay Error Due to Lens Coma and Asymmetric Illumination Dependence”, H. Nomura et al., *SPIE*, Vol. 3332, 199:210, 1998; and see “The Effects of an Incorrect Condenser Lens Setup on Reduction Lens Printing Capabilities”, D. Peters, *Interface 85*, Kodak Publ. No. G-154, 66:72, 1985; “Impact of Local Partial Coherence Variations on Exposure Tool Performance”, Y. Borodovsky, *SPIE*, Vol. 2440, 750:770, 1995; “Condenser Aberrations in Kohler Illumination”, D. Goodman et al., *SPIE*, Vol. 922, 108:134, 1988; “Mathematical Treatment of Condenser Aberrations and their Impact on Linewidth Control”, C. Krautschik et al., *Intel*, 1:12, 1998; “Examples of illumination Source Effects on Imaging Performance”, A.J. deRuyter et al., *ARCH Chemicals Microlithography Symposium*, 2003. Comprehensive modeling will generally require knowing the radiant intensity across the projection field, machine settings, and machines. See, for example, “Understanding Systematic and Random CD Variations using Predictive Modeling Techniques”, D. Flagello et al., *SPIE*, Vol. 3679, 162:175, March 1999; “Understanding Across Chip Line Width Variation: The First Step Toward Optical Proximity Correction”, I. Liebmann et al., *SPIE*, Vol. 3051, 124:136, 1997.--

Column 6, lines 4-9, please amend as follows:

--Another design point, referring to FIG. 1, with a chrome opening CO in a chrome coating on the reticle face RF, is large enough to allow the entire source as represented by the marginal imaging point MIP of FIG. 5 to pass. One of the main ~~reason~~ reasons for keeping some chrome coating is to reduce stray light reflection off of the reticle.--

Column 10, lines 50-67, please amend as follows:

--When recording the source images in photoresist on a wafer, the process flow of FIG. 19 is used. First an MFISIO as described herein is provided and loaded onto the machine we are characterizing. Next a resist coated substrate (wafer) is provided and loaded on the machine. Next, the substrate is exposed at multiple, increasing exposure

UNITED STATES PATENT AND TRADEMARK OFFICE

CERTIFICATE OF CORRECTION

PATENT NO. : 7,088,427 B2
APPLICATION NO. : 10/828579
DATED : August 8, 2006
INVENTOR(S) : Smith et al.

It is certified that error appears in the above-identified patent and that said Letters Patent is hereby corrected as shown below:

Column 10, lines 50-67, (cont'd)
doses at discretely separated image fields on a ~~wafer~~ wafer. See, for example, page 3 of "Examples of Illumination Source Effects on imaging Performance" by A.J. de Ruyter et. al. in 2003 ARCH Chemicals Microlithography Symposium, *supra*. The substrate is then developed and the exposed images are photographed one by one. From these images and knowledge of the exposure dose sequence, the "raw" intensity contours of $\frac{dE}{do}$ (nx,ny) are obtained. Next these intensity contours are computationally overlapped and the radiometric and the exit pupil transmission correction factor (Equation 4) are applied to reconstruct the normalized radiant intensity (FIG. 21):--

Signed and Sealed this

Twenty-seventh Day of March, 2007

JON W. DUDAS
*Director of the United States Patent and Trademark Office*